US005557537A

United States Patent [19]
Normann et al.

[11] Patent Number: 5,557,537
[45] Date of Patent: Sep. 17, 1996

[54] METHOD AND APPARATUS FOR DESIGNING AND EDITING A DISTRIBUTION SYSTEM FOR A BUILDING

[76] Inventors: Linda M. Normann, 664 Leslie La., Glendale Heights, Ill. 60139; Charles L. Hines, III, 345 E. Hickory, Hinsdale, Ill. 60521; Gene M. Cox, 3954 W. Woodlake Dr., Columbus, Ind. 47201

[21] Appl. No.: 466,361

[22] Filed: Jun. 6, 1995

Related U.S. Application Data

[63] Continuation of Ser. No. 261,760, Jun. 17, 1994, abandoned, which is a continuation of Ser. No. 876,003, Apr. 29, 1992, abandoned, which is a continuation-in-part of Ser. No. 551,919, Jul. 12, 1990, abandoned.

[51] Int. Cl.⁶ ....................................................... G06F 17/50
[52] U.S. Cl. .......................... 364/512; 364/488; 434/72; 395/921
[58] Field of Search ............................. 364/488, 505, 364/512, 578, 226.7, 917.96; 434/72, 75, 79, 428; 395/919, 921

[56] References Cited

U.S. PATENT DOCUMENTS

| | | | |
|---|---|---|---|
| 4,181,954 | 1/1980 | Rosenthal et al. | 364/512 X |
| 4,353,117 | 10/1982 | Spellman | 364/512 X |
| 4,700,312 | 10/1987 | Watanabe et al. | 364/488 |
| 4,789,944 | 12/1988 | Wada et al. | 364/488 |
| 4,831,546 | 5/1989 | Mitsuda et al. | 364/512 |
| 4,847,778 | 7/1989 | Daley | 364/474.22 |
| 4,964,060 | 10/1990 | Hartsog | 364/512 |
| 4,992,953 | 2/1991 | Yoshida et al. | 364/512 |
| 5,006,991 | 4/1991 | Ohcoshi et al. | 364/512 X |
| 5,019,992 | 5/1991 | Brown et al. | 364/512 X |
| 5,227,983 | 7/1993 | Cox et al. | 364/512 |

OTHER PUBLICATIONS

Zhu et al., "A Symbolic Approach to the Fast Design of Industrial Piping Systems," Proceedings of the SAE/ESD International Computer Graphics Conference, Apr. 1987, pp. 69–73.

Tracy, "Facility and Equipment Engineering Quality Assurance Through CAD—A Case History," Proceedings of the SAE/ESD International Computer Graphics Conference, Apr. 1987, pp. 53–62.

*Primary Examiner*—Collin W. Park
*Attorney, Agent, or Firm*—Olson & Hierl, Ltd

[57] ABSTRACT

A method and apparatus for designing and editing a distribution system for a building is disclosed. Elements of such distribution systems and requirements of relevant standard, are stored in a computer's memory. Building parameters are entered into a computer manually. The user identify the standard to be followed and the element to be optimized. The system divides the building into sections as appropriate to the user identified standard. The system then computes layout needed to comply with the selected standard. The layout is routed and sized to avoid building structural members, yet the elements of the layout are optimized for size and length. The apparatus prints out a hard copy of the design layout which can include an elements listing needed to complete the system. The design layout as well as the building parameters can be edited. The edited layout is checked for compliance with the identified standard as well as avoidance of building parameters.

28 Claims, 20 Drawing Sheets

FIG_4

FIG_9_

METHOD AND APPARATUS FOR DESIGNING AND EDITING A DISTRIBUTION SYSTEM FOR A BUILDING

This is a continuation, of application Ser. No. 08/261,760, filed Jun. 17, 1994, now abandoned, which is a continuation of application Ser. No. 07/876,003, filed Apr. 29, 1992, now abandoned, which is a continuation-in-part of application Ser. No. 07/551,919, filed Jul. 12, 1990, now abandoned.

TECHNICAL FIELD

This invention relates to a method and apparatus for designing and editing a distribution system for a building and, in particular, to an automated system for designing and editing the distribution system.

BACKGROUND OF THE INVENTION

Distribution systems are found in every building. Such distribution systems provide for the movement and channelling of gases, liquids and electricity through a building. In any building, there are one or more distribution systems including a sprinkler system, duct work for heating, ventilation and air conditioning, plumbing and electrical systems.

One major type of distribution system is a sprinkler system for fire containment which is found in many buildings today. In today's society, any building where people congregate to live, work or play such as office buildings, factories, hotels, motels, apartment buildings, condominiums or shopping malls likely will include a sprinkler system to protect the public from a fire catastrophe.

Governmental bodies have recognized the need to protect against catastrophic fires by legislating standards for sprinkler systems into their building codes. Also, insurance companies, fearful of the potential liability of a catastrophic fire, have often demanded sprinkler systems in buildings as a condition for insurance coverage.

A building will have to comply with one or more standards for any distribution system. First, any building will need to comply with the standards set forth in relevant governmental codes. Often, insurance companies will require compliance with standards which may be tougher than the relevant governmental code. These standards can be set by the industry itself such as the National Fire Protection Association (NFPA) guidelines or the standards may be set by an insurance company directly.

A design for a sprinkler system must take into account many factors. The primary concern is ensuring adequate containment in the event of a fire. Thus, the spacing as well as the available water volume and water pressure at the sprinkler heads must be considered. Consideration must be given to the occupancy use to be made of a building. A chemical factory utilizing flammable solvents will require a different sprinkler system than a shopping mall.

In addition, there are many engineering or architectural constraints placed on sprinkler system design. For example, if interconnected sprinkler lines do not lie in a horizontal plane, drains must be inserted to allow water flow to prevent freezing. This is particularly true in the case of a dry sprinkler system which must not contain water except during actual use.

The sprinkler system must be designed with other building elements and adjuncts in mind. Locations must be found to hang the sprinkler system. Manually determining paths which avoid these obstructions, where to support the sprinkler system, how to allow each line to lie in a plane yet providing an adequate water supply which meets all requirements is difficult, tedious and very time consuming.

The concerns expressed above for a sprinkler system also relate to heating, ventilation and air conditioning (hereafter "HVAC"), plumbing and electrical systems. Standards also must be complied with when designing these systems for a building. The proper amount of light, ventilation and heat must be provided for each area.

The problem is compounded when, as usual, the various distribution system subcontractors must work out between themselves where to position the electrical conduits, the HVAC duct work, the plumbing piping and the sprinkler system. Generally, an architect or a general contractor designs the building elements such as beams, walls and joists. Left for the subcontractors is usually a space near the top of the steel. Into this space must go the various building adjuncts such as electrical conduit, overhead lighting fixtures, HVAC duct work and sprinklers. It is left to the subcontractors among themselves to specifically locate each such adjunct system.

Still another concern is keeping the cost of the system reasonable without sacrificing system performance. Designing a system which utilizes material in the most cost efficient manner is very difficult. For example, piping comes in standard lengths which are then cut to size as needed. Two sometimes conflicting concerns are (1) minimizing labor costs by minimizing the number of cuts and (2) reducing the left-over scrap material. Balancing these concerns is not a trivial exercise for an engineer.

In addition, the engineer must design a system which provides adequate HVAC to all parts of a building given the varying conditions different portions of a building may encounter. For example, the HVAC requirements for the sunless north side of a building will differ from the full sun south side or the half day sun of the east and west sides. As is apparent, designing a distribution system manually is an onerous task. There is a need for a system which automatically performs these tasks.

What is needed is a system which coordinates the layouts of all the various distribution systems needed for a building. Such a system should provide for efficient design of the system, not only for its operation, but also its installation and cost.

The system should also provide hard copy or design for use in constructing the designed system. This hard copy can be used by people installing the electrical or sprinkler system at the construction site. It would also be useful if the system would provide a complete listing of the elements needed to install the distribution system.

The present invention meets these desires.

SUMMARY OF THE INVENTION

The invention is a method and apparatus for designing and editing a distribution system for a building. The distribution system can be any system used in a building including plumbing, electrical, sprinkling, ventilating and related systems or any combination of such systems. Information about the distribution system elements and various standard requirements is stored into a memory of a computer. Information about the building elements and adjuncts including location of walls and similar obstructions are entered into a computer. These building elements and adjuncts are then stored in the memory of the computer. The user can edit the building elements and adjuncts as desired. The user also selects the particular standard which is applicable to the building being constructed. For example, this may be a particular standard for lighting systems or a particular fire code used to design a sprinkler system.

A computer program then divides the building into suitable floors and then each floor into sections. Sections most often are either bays which are defined by the location of the beams of the building or individual rooms defined by the walls. This division breaks the problem down into manageable proportions.

The computer program then computes the layout needed for the distribution system based upon the selected standard. For example, how much light or ventilation is needed in a particular room. The layout is routed as economically as possible while avoiding the building elements and adjuncts. In addition, the quantity and location of hangers needed to support the distribution system as well as other special fittings needed are calculated. These computations are repeated for each section.

After the computations are complete, the program stores the information in memory and then can print out hard copy of the layout of the system. Also, an elements listing showing the number of components can be printed. For example, this will list how many and what type of light fixtures and wire are needed or, in the case of a sprinkler system, how many and what types of sprinkler heads and pipes are needed. Lastly, the most economical plan for cutting elements (e.g. pipes) to size is devised and printed.

An editing capability is provided to allow the user to edit either the layout or the building elements and adjuncts. In either case, the layout is reconfigured to include the proposed changes if still in compliance with the identified standard. Otherwise, error messages are generated.

BRIEF DESCRIPTION OF THE DRAWINGS

In the accompanying drawings, which form a portion of this disclosure.

DESCRIPTION OF THE PREFERRED EMBODIMENTS

A computer system for use in the design of distribution systems preferably consists of a CRT display and a keyboard-type input operatively connected to a computer. The computer is preferably operatively linked to a plotter, a printer and disk type storage units. For ease of description, the example of a sprinkler system is given, however, many of the same elements apply to other distribution systems. A sprinkler system is generally the most complicated and accordingly serves as a good example.

As described in detail later, elements of a distribution system are first stored on the disk type storage units. For a sprinkler system, the elements include information regarding all standard sprinkler heads, piping, fittings, hangers, drains including physical dimensions and fluid flow capacities.

Also stored on the disk type storage units are the requirements of relevant standards. The requirements can include the number, type, separation and water supply for sprinkler heads demanded by a particular governmental body or an insurance company.

A building designer or architect enters into the computer data regarding the building elements and adjuncts of buildings. The entry of the data may be accomplished though a number of methods. Examples include directly through the keyboard, floppy disk or modem. The building elements and adjuncts will include, among others, the dimensions and locations of the water stub-in, beams, columns, walls, ceilings, floors, girders, joists and electrical equipment. The building designer or architect also selects a standard to which the building must comply. Lastly, the designer chooses the elements to be optimized when constructing a building. For a sprinkler system, the designer generally will select either lines or sprinkler heads for optimization. For purposes of orientation, the lines will generally be parallel to the beams.

Figure 10:
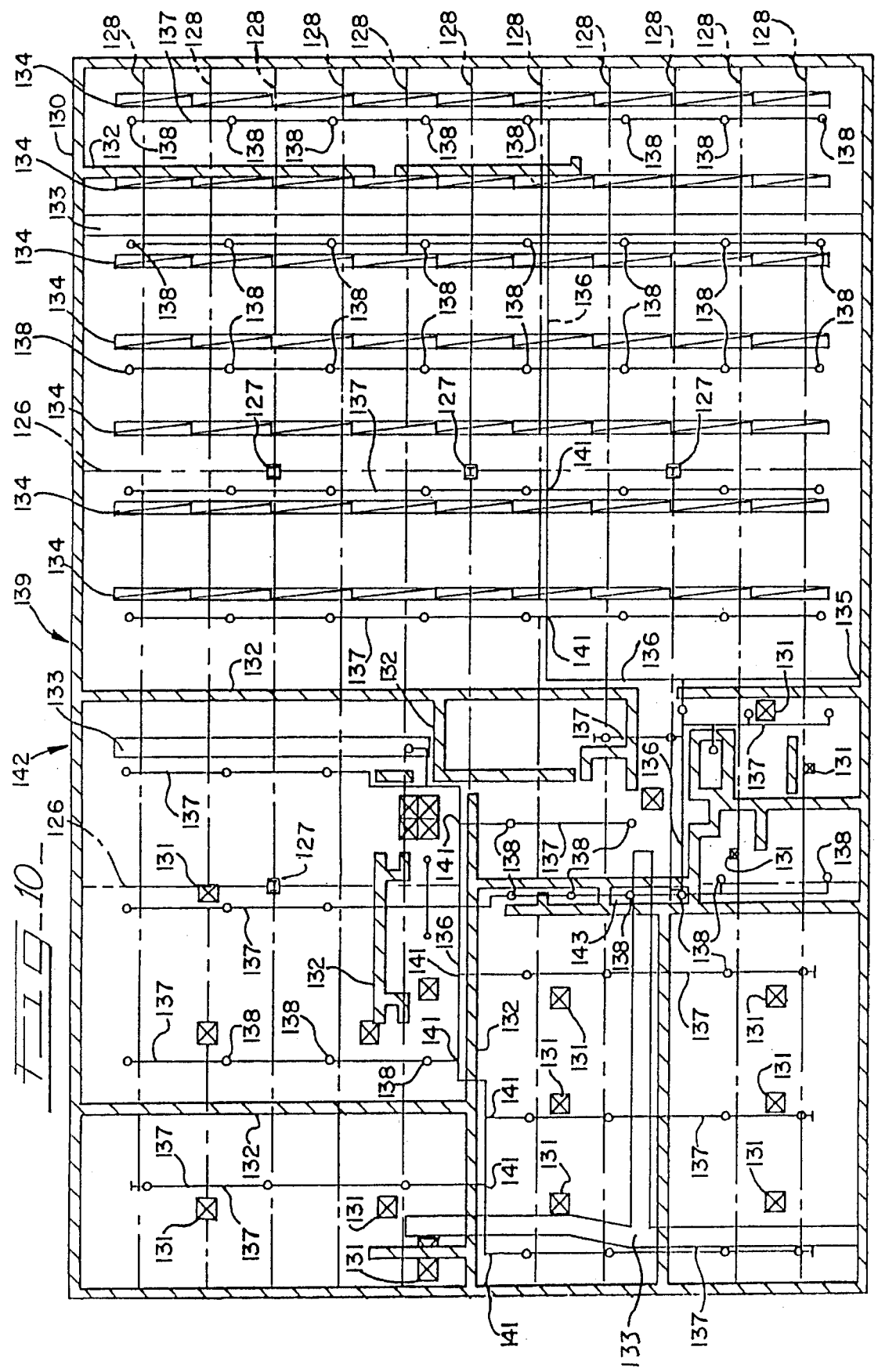
FIG. 10 is a diagram of a sprinkler system for combined warehouse and office space designed by the present invention.

The computer program preferably treats each floor of a multistory structure as a separate building. The computer program provides two options for dividing the floors. In the first method, each floor is divided into sections which are oriented horizontally and are defined by the location of the beams. Generally, though not always, this method is utilized for large, open floor plan buildings such as warehouses. In the second option, the building is divided into individual rooms as per the floor plan. This method is generally used for office buildings and the like. Both methods may be used in one structure. As seen in FIG. 10, one example of mixed use is a warehouse wherein the main storage area may be divided by the first method, but the office area may be done by the second method. Whatever the method, as hereinafter used, the term "section" refers to bays as in option one or rooms as in option two.

The computer program selects a section to begin its analysis. The first step is the determination of the number and location of the lines. The width of the selected section is divided by a maximum distance between lines permitted in the user selected standard.

The resulting number is rounded up to a next highest whole number, this whole number being the number of lines for this section. The number of lines is then also divided into the width of the section. The result of this division is the minimum distance between lines. Note that the minimum distance between lines may equal the maximum distance between lines if the width of the section divided by the maximum distance between lines is a whole number.

The placement of a first line from the first lengthwise wall is computed by dividing the minimum distance between lines by two. The first line is then located parallel to the first lengthwise wall at the placement distance.

The computer electronically checks the location by running an obstruction analysis which compares the location of the first line with the building elements and adjuncts input data to determine if there is a conflict. If there is a conflict, the first line will be relocated an incremental distance away from the first lengthwise wall and the computer reruns the obstruction analysis. The relocation-obstruction analysis cycle is repeated until either the separation between the first line and the first lengthwise wall exceeds one half the maximum distance between lines or an obstruction free path is found.

Preferably, the incremental distance chosen initially is one foot (30 cm.). If an obstruction free path is not found before one-half the maximum distance is reached, the program repeats the cycle using an incremental distance of one inch. If an obstruction free path is still not found, the computer notifies the user and manual editing may be required to either relocate the elements of the section, the line or adding more lines to allow complete coverage.

If an obstruction free path is found, then the computer moves on to locating a subsequent line. The placement distance for subsequent lines is the minimum distance between lines. Any subsequent line is also located parallel to the beams.

Again, the computer repeats the obstruction analysis for the subsequent line. If a conflict is found, the subsequent line will be relocated the incremental distance from the first or preceding line until either the separation between the first or preceding line exceeds the maximum distance between lines or else no obstruction is found.

Preferably, the incremental distance is initially one foot (30 cm.) with a second pass at one inch (2.5 cm.) if no obstruction free path is located on the first pass. Again, preferably the designer will be notified if neither pass finds an obstruction free path. The subsequent line locating procedure is repeated until the total number of located lines equals the calculated number of lines needed.

The next step is determining the number and location of sprinkler heads needed to comply with the selected standard. The length of the section is first multiplied by the minimum distance between lines to yield the total area heads on a given line must cover. From the selected standard, the computer finds the maximum area a single head is to cover. The total area per line is divided by this maximum area. The result is rounded up to the next whole number which is the number of heads per line.

The minimum distance between heads is determined by selecting the lessor of:

a) dividing the length of the section by the number of heads;

b) dividing the maximum area a head is to cover by the minimum distance between lines; and c) the maximum distance between heads allowed under the selected standard.

The placement distance from the first widthwise wall of a first head is determined by dividing the minimum distance between heads by two. The first head is positioned along the line at the placement distance from the wall.

The computer electronically checks the location of the first head by running an obstruction analysis. The analysis compares the location of the first head with the location input of building elements and adjuncts data to determine if a conflict exists. The obstruction analysis checks not only the head itself, but the projected spray from the head to ensure proper coverage.

If there is a conflict, the first head will be relocated at an incremental distance further from the first widthwise wall. The obstruction analysis is then rerun. The relocation-obstruction analysis cycle is repeated until either an obstruction free area is found or the separation between the first head and the first lengthwise wall exceeds one half the maximum distance between lines.

In this preferred embodiment, the incremental distance chosen initially is one foot (30 cm.). If an obstruction-free path is not found before the one half maximum distance is reached, the program will repeat the cycle using a one inch incremental distance. If an obstruction free path is still not found, the computer notifies the user and manual editing will be required to either relocate building elements and adjuncts or customize a head location.

If an obstruction free path is found, then the computer moves to locating a subsequent head. The procedure is the same as detailed above except for using the minimum and maximum distances between heads instead of one half the minimum and maximum distances between heads. The cycle is repeated until the number of located heads equals the number heads calculated for the line. If that is the case, the computer then moves to a subsequent line and locates the heads on the subsequent line. The cycles continue until all the heads are located for a given section.

The preferred embodiment is as described above. Alternatively, the computer can be programmed to calculate the number and location of heads first and then connect the heads via lines.

The computer program now determines the number of mains needed in a section. Preferably, one main is used if the number of heads per line is seven or less. Two mains are used if the number of heads per lines is greater than seven.

The mains are oriented perpendicular to the lines and in the same plane just below the beams. The main will overlap all the lines preferably by at least six inches on either side.

If only one main is used, the computer divides the number of heads per line by two and truncates, the result to an integer. The main is placed between the head corresponding to the integer value and the head corresponding to the integer value plus one as counted from the first head.

If two mains are used and there are eight or nine heads per line, a first main is located between the first head and the first widthwise wall. A second main is located between the seventh and eighth heads as counted from the first head.

If two mains are used and there are ten or more heads per line, the first main is located between the second and third heads as counted from the first head. The second main is located between the second to last and the third to last main as counted from the first head.

The computer now searches through the stored sprinkler elements to determine the proper fittings to connect the heads to the lines and the lines to the mains. The mains are connected to the water stub-in where the water enters the building. Hangers will be added to support the pipes. An appropriate slope, preferably one half inch in ten feet will be computed. This completes the sprinkler system for the section.

The computer program stores the completed section into the disk storage means. Another section is selected and the process described above repeated until the sprinkler system layout for the entire building is finished and stored.

A hydraulic analysis is performed on the entire system which must be within the limits of the available water supply, including the static pressure, the residual pressure and the residual flow. The appropriate test for the selected standard is chosen. Various factors including the density per area, rules of NFPA 13, Hazan-Williams coefficient and the K factors for the heads to be used in the tests. The largest head coverage area in the most physically remote section is initially selected.

The computer begins a Newton-Raphson analysis which sets up an NxM matrix wherein "N" equals the number of pipes with differing flows or pressures and "M" equals the number of parameters evaluated. Preferably, "M" equals fourteen. These parameters include the pipe length, pipe diameter and "K" factors for the heads or other outlets.

Using the Newton-Raphson matrix, the computer may evaluate:

1) Minimum water pressure needed for the system to function per the selected standard;

2) The flow at any given input pressure; or

3) The flow at the given input pressure.

As an alternative, a Hardy Cross analysis may be performed. In either case, the computer can supply the hydraulic data for any line, main or head in the building. If any problems are detected, manual editing with recalculation is possible. Preferably, at any step through this computer, a user may manually edit lines, mains, heads or the building elements and adjuncts of the building. For example, if an obstruction analysis shows a beam blocking a pipe, then the program will suggest an alternate path which avoids the beam.

Once the entire system is completed and checked, hard copy, including blueprints, can be generated to supply the user. Also, a full inventory of fittings, piping, hangers, heads and drains needed is available. As an additional benefit, the computer will optimize the cutting of standard 21, 24 or 25 foot piping lengths or combinations thereof to minimize the time and scrap generated. This alone can result in substantial savings.

Referring to FIGS. 1–9, an alternative embodiment is described. This alternative embodiment is very similar to the embodiment described above. However, there are differences which will be pointed out as they occur.

Figure 1:
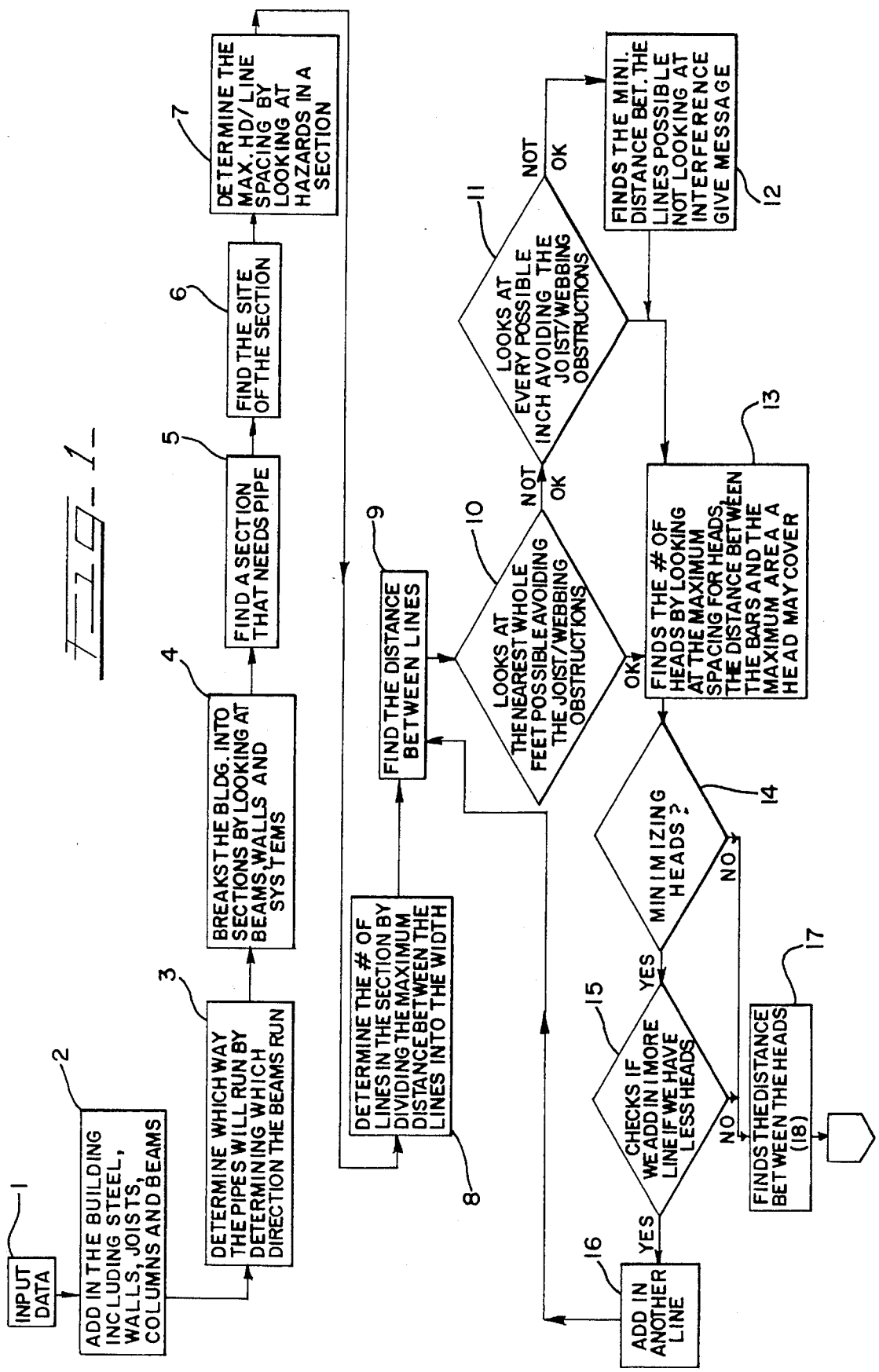
FIGS. 1 through 9 in combined form represent a flowchart of the computer program used in generating the present invention.

Referring to FIG. 1, blocks 1 and 2, the user inputs data which includes the steel, walls, joists, columns and beams. Also included is the location of the water stub-in for this particular building. Again, as used herein the term building includes the individual floors of a multi-story structure.

In block 3, the computer next determines which way the pipes are run by determining the direction the beams run. As in the previous embodiment, the lines will run parallel to the beams.

In block 4, the computer breaks the building into sections by looking at the beams, walls and systems as appropriate. The term "sections" as used herein includes both the bay sections which are the open spaces between beams or rooms which are determined by the location of walls. Again, these sections are determined by what use is to be made of the structure.

In block 5, the computer determines which sections have not had a sprinkler system installed with the program. It then selects a section to electronically install the sprinkler system. In the next block, the program determines the location of this particular section within the entire structure.

In block 7, the computer will get data from the user relating to the hazards which a particular section will encounter. This entails a knowledge of the activities which will occur in a particular section. The hazards within a section will determine the maximum head and line spacing as determined by the building standards the user selected.

In block 8, the computer will determine the number of lines in the particular section by dividing the maximum distance between the lines into the width of the section. The width of the section is the direction perpendicular to the beams.

In block 9, the computer determines the distance between lines for this particular section. The computer, in blocks 10 and 11, evaluates possible routes to avoid joists and other obstructions. Block 10 does the evaluations to the nearest foot to avoid these obstructions. If a clear path is not found in block 10, then block 11 evaluates possible paths every inch to seek to avoid the obstructions. If a clear path is not found, the computer simply finds the minimum distance between lines without looking at any possible obstructions or interference as shown in block 12. The computer will give a message to the user that it is doing so.

Once a path is determined, the computer in block 13 will find the number of heads to be placed on the line by looking at the maximum spacing for heads, the distance between the lines and the maximum area a head may cover.

In block 14, the user will input into the computer whether or not the user is minimizing the number of heads or the number of lines in this particular system. If the user is minimizing heads in block 14, the computer will check in block 15 and see if adding an additional line will result in fewer heads.

If adding a line does result in fewer heads, the computer will add an additional line by determining that the number lines in the section is now the original determination plus one and repeat the cycle beginning with block 9. If the user is not minimizing heads or if adding a line does not reduce the number of heads, the computer will calculate the distance between the heads necessary for each line as shown in block 17.

Figure 2:
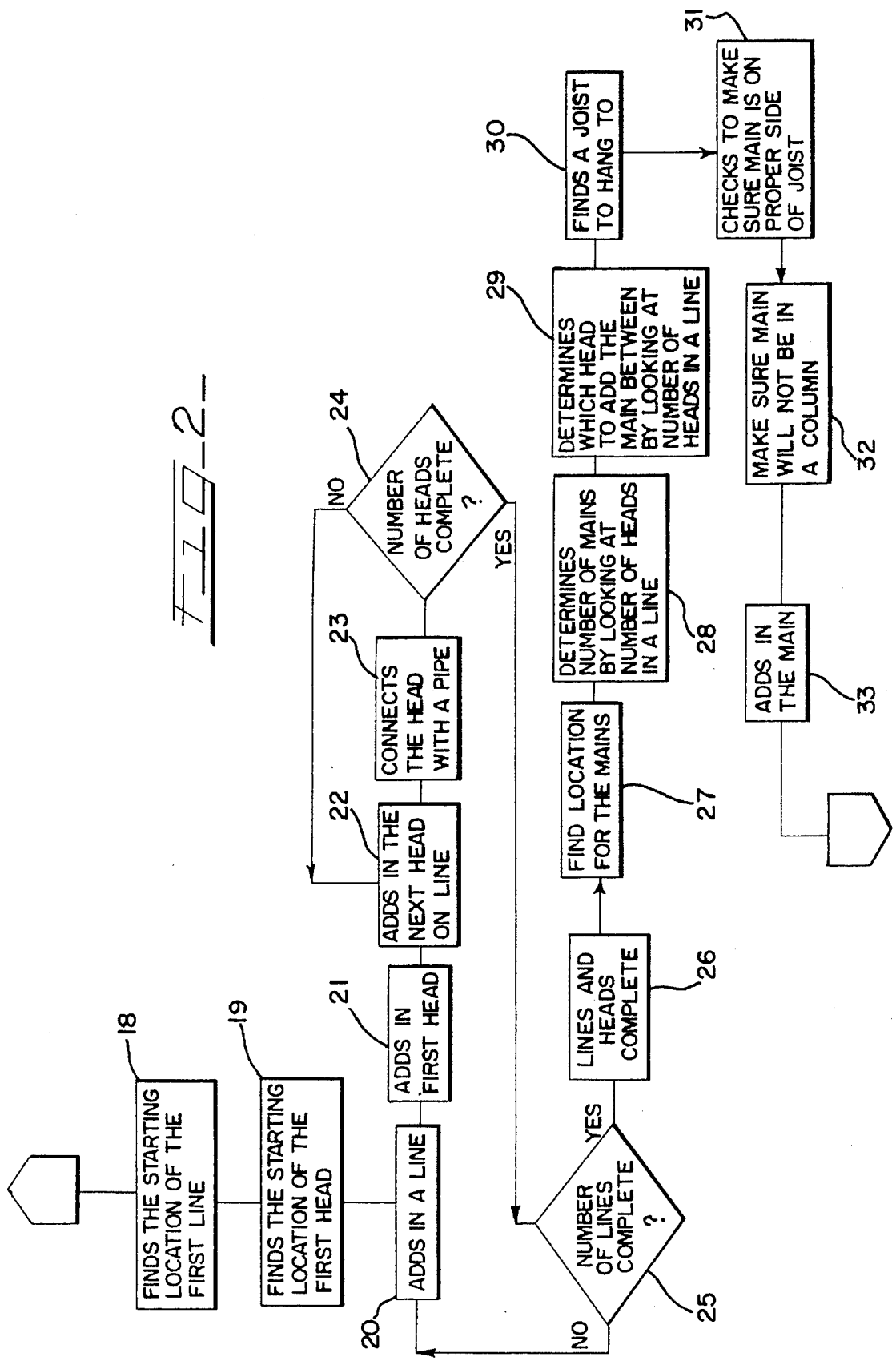

Turning now to FIG. 2, in block 18 the computer determines the starting location of the first line. The method is as described in the earlier embodiment. Once the location is found, in block 19 the computer then determines the starting location of the first head on this line. Note that this contrasts with the earlier described embodiment wherein all the line locations were found before positioning any heads. The computer will store these locations into its memory in block 20.

The computer will continue to add heads onto the line and connect the heads to the pipe as noted in the cycle denoted by blocks 20 through 24 until the number of heads calculated in block 13 are positioned.

The next determination, in block 25, is whether the number of lines calculated in blocks 8 or 16 are located. If the answer is no, then it will add in another line as described above in block 18 and the sequence picks up from there. If the number of lines is complete, then the next step is to move on to determining the location for the mains as noted in block 26. In blocks 27 and 28, the computer determines the location and number of mains. The number of mains is determined by looking at the number of heads on a line as described in the earlier embodiment. It then determines in block 29 where to position the main relative to the heads. The computer finds a joist to support the mains in block 30. Determining which joist to use involves checking that the main is located on the proper side of the selected joist in block 31. If the main is located on the wrong side of the joist, it may have to be relocated as this can make connecting to the lines very difficult.

It also makes sure in block 32 that the main will not intersect a column. Of course, inserting a line through a column which might involve some drilling could damage the structure of the building. The computer adds in the main by storing the location and size to the appropriate memory means in block 33.

Figure 3:
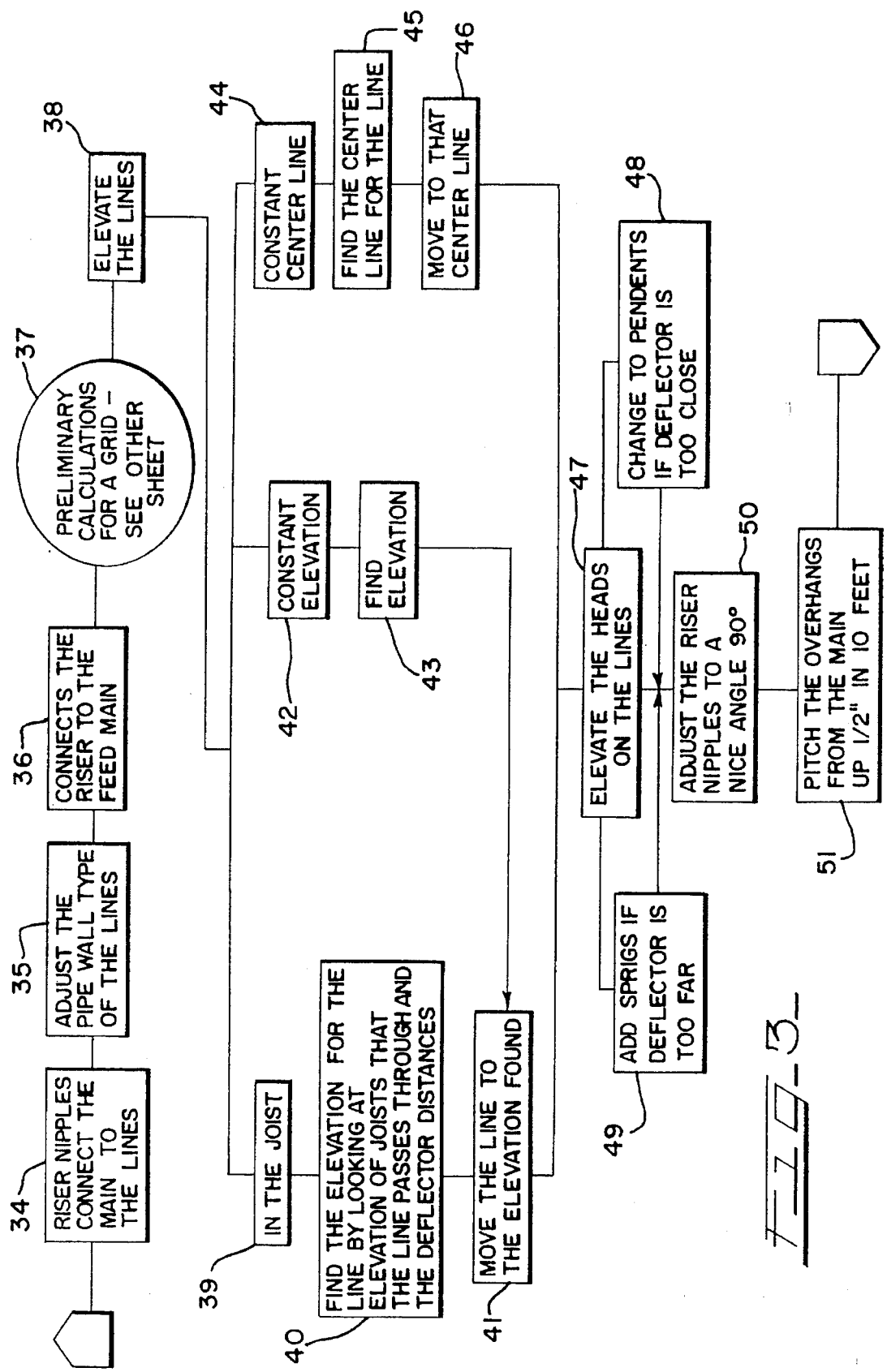

Turning now to FIG. 3, block 34, the computer electronically connects the mains to the lines via riser nipples. Riser nipples are piping which is set at ninety degree angles and comes out of the top side of the mains.

The program in block 35 adjusts the pipe wall type of lines which involves determining the wall thickness of the pipe for the lines. The computer lastly connects the mains and the riser to the mains to the water stub-in which was input in block 1.

The next step in the procedure is to elevate the lines. Prior discussion located the lines in a horizontal plane. This next analysis locates the lines in a vertical plane.

There are three alternative methods of elevating the lines. The first method is described in blocks 39–41 and located in the mains in the joists. The elevation of the lines is determined by looking at the elevation of the joists that the line passes through and the deflector distance of the heads. With exposed construction, the lines can then be moved to place the deflectors an appropriate amount of distance from the structure such as four inches (10 cm). As another alternative, the computer may locate the lines at a constant elevation and in blocks 42 and 43.

In the third and last methods, the computer may elevate the lines based on a center line. The center line is the distance from the top of the steel. The line is moved to place the deflector four inches (10 cm) from the top of the steel. This option is used in open warehouse environments without a drop ceiling.

In block 47, the computer elevates the heads on the lines. This is done by analyzing where the location of the deflector is compared to the top of the steel. If the deflector is too close to the top of the steel, the computer will change the head to a pendant type which hangs beneath the lines as opposed to the normal which is mounted above the line as shown in block 48. Alternatively, if the deflector is too far from the top of the steel, the computer will add sprigs to the head which mounts the head even further above the line than would be normal as shown in block 49.

Figure 4:
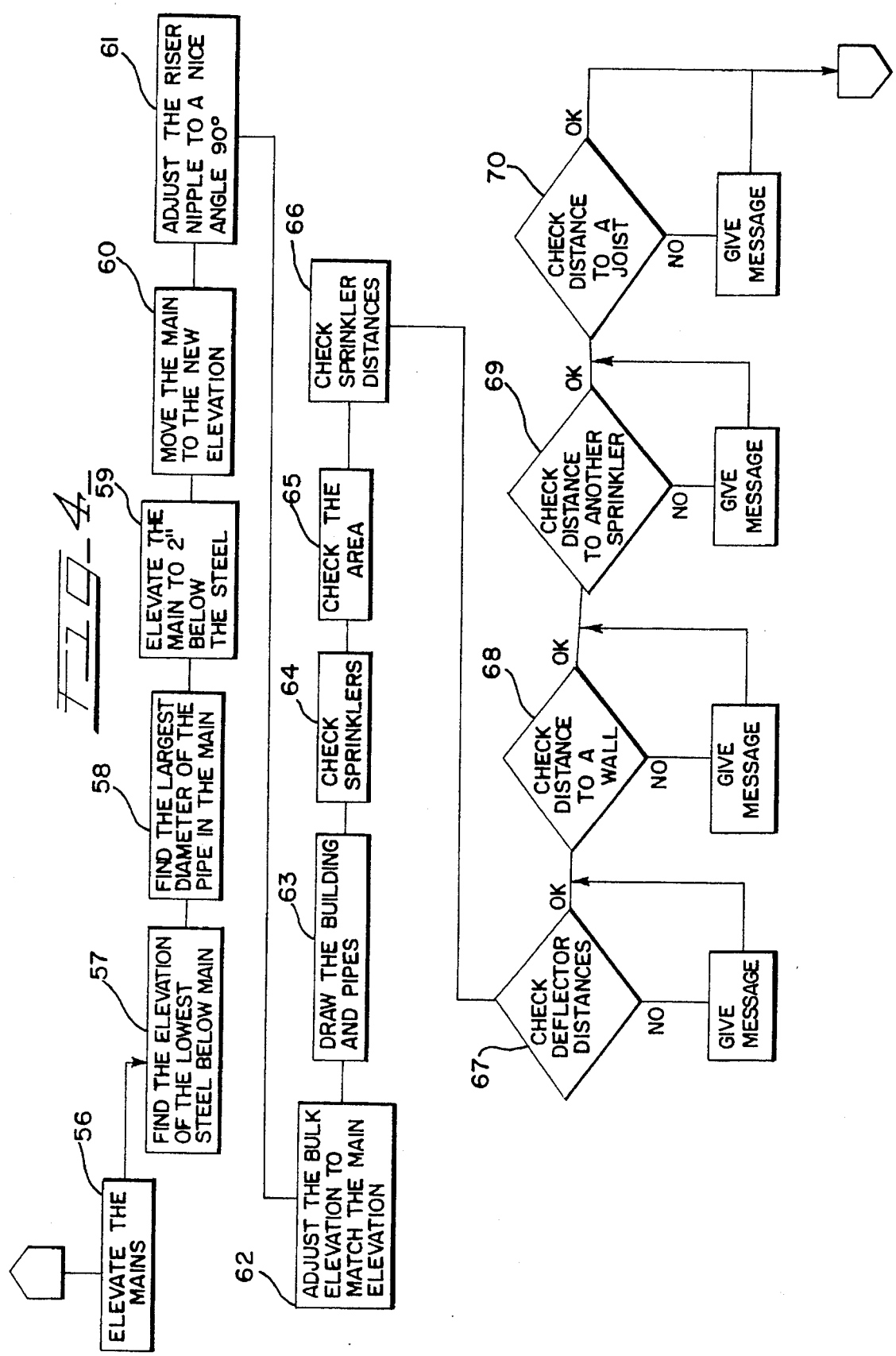

The computer as shown in block 50 adjusts the riser nipples to a ninety degree angle. In block 51, the computer pitches the part of the lines which overhang the mains to up to one-half inch in approximately ten feet. Turning now to FIG. 4, the computer's next task in blocks 56–62 is to elevate the mains themselves. First, the computer determines the elevation of the lowest intersecting steel below the main. The computer checks the joists and beam elevations input in block 1 and takes the lowest elevation.

In block 58, the computer finds the largest diameter of the pipe in the main and in block 59 simply elevates the main to two inches below the lowest steel found. The computer in block 60 moves the main to the new elevation. Again, the computer adjusts the riser nipple to get a ninety degree angle. The computer then adjusts the bulk elevation to match this main elevation.

In blocks 63–70 the computer performs a check of the system as located. The computer checks the heads and checks that the heads cover the areas they are designed to cover. These checks also include reviewing deflector distances to the top of the steel to see if it is located properly.

Next, the computer checks the distance to any walls in the vicinity and makes sure the distance from the head is correct. The computer checks the distance to nearby heads to be assured that the heads properly cover. Finally, the computer checks the distance to any nearby joists to be assured clearance is adequate. If a problem is discovered, a message is always given to the user.

Figure 5:
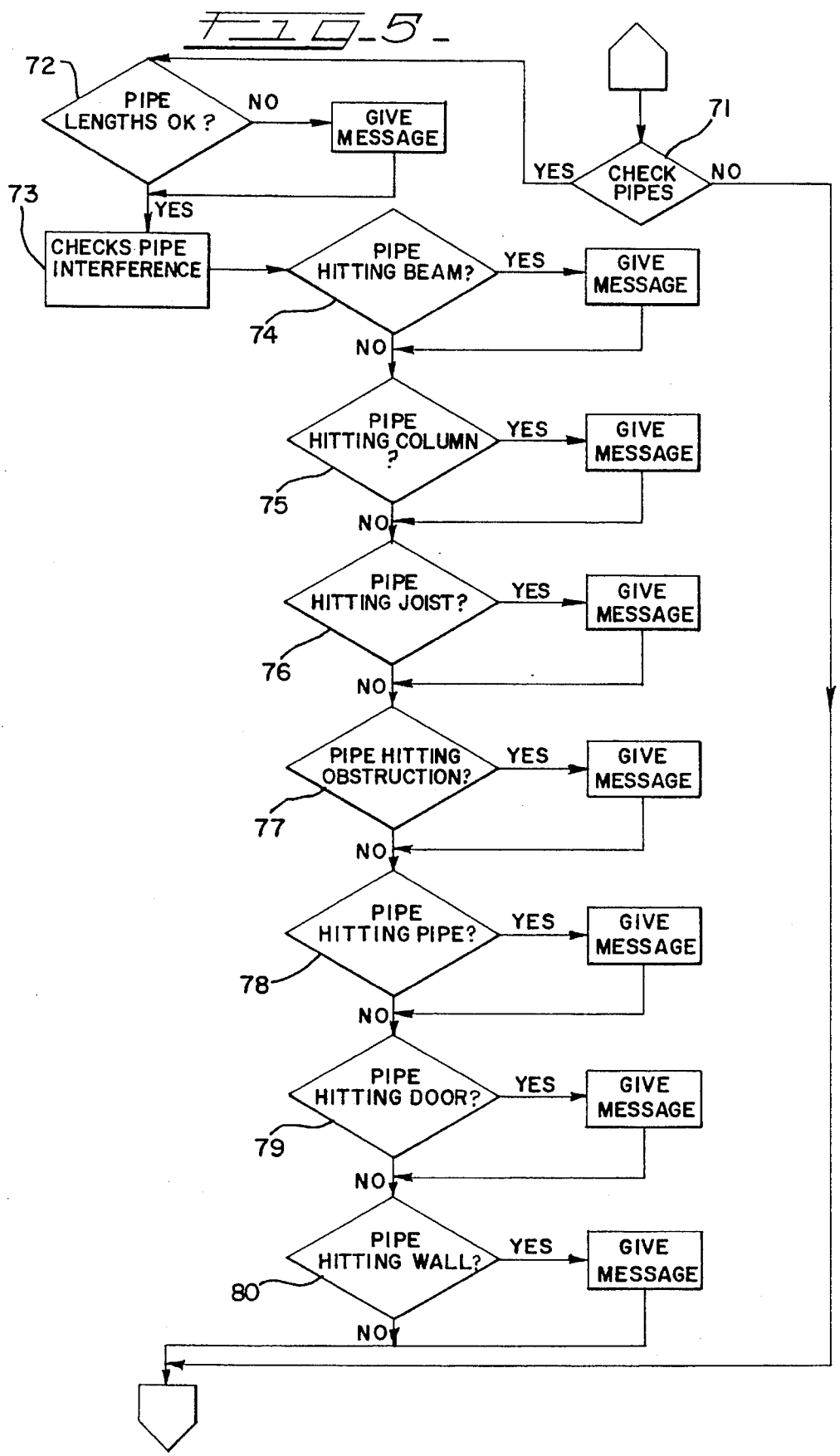

In FIG. 5, the systems checks continue in blocks 71 through 80. Now, the computer begins to look at the piping rather than the heads. The first check is to see whether the piping lengths are adequate. Then it begins to check whether the pipes avoid obstructions. First, the computer evaluates whether the piping intersects any beams, columns, joists or other obstructions found in the building. The computer also checks to see if the pipes are not intersecting with one another or impeded by any doors or walls which have been installed.

Figure 6:
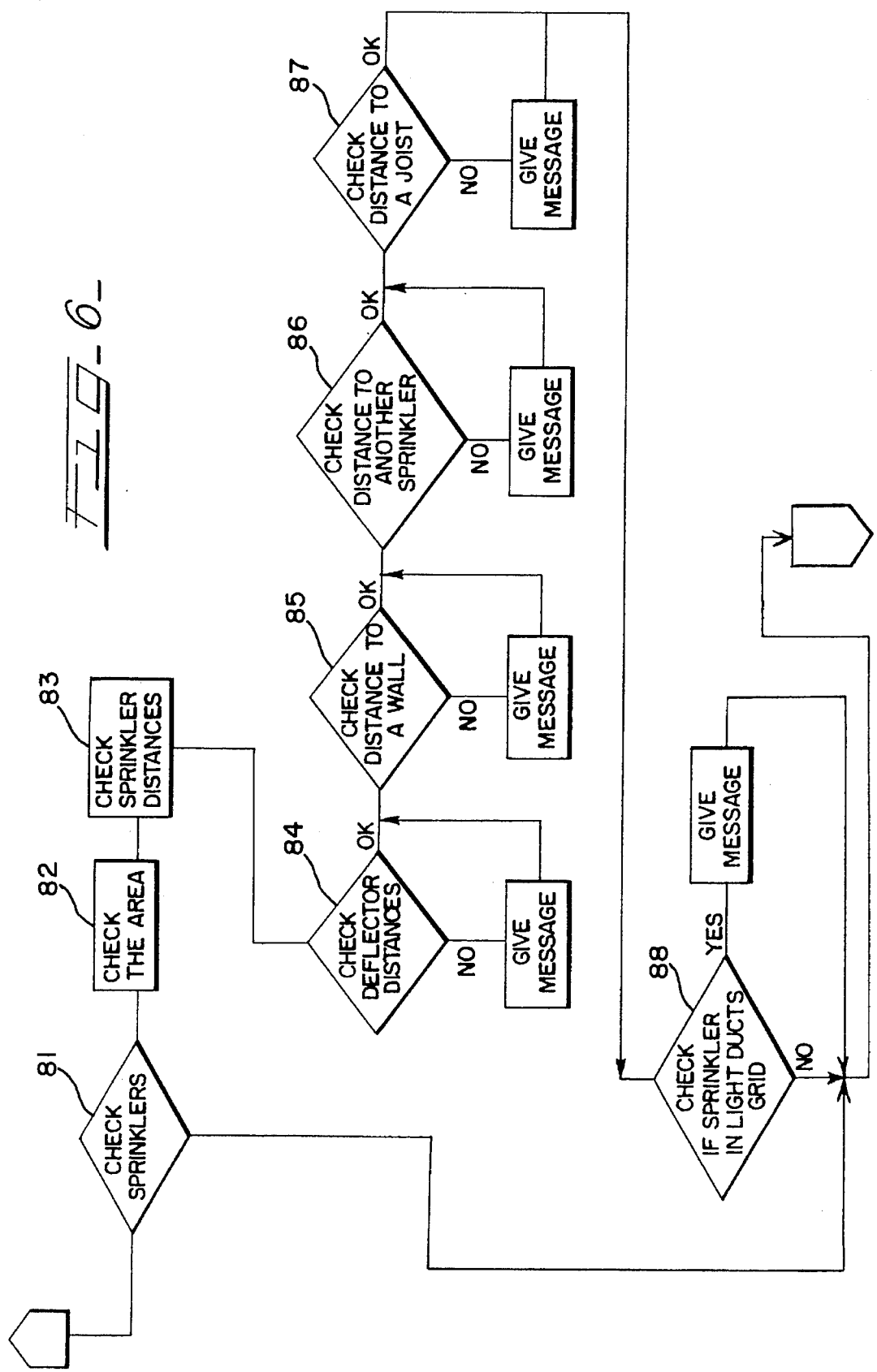

In FIG. 6, in blocks 81–88, there is a second check of the sprinklers to make sure that they are adequate. This check is very similar to the one described in FIG. 4. The only addition is in block 88 where the computer checks that the sprinkler head is not located in a light fixture.

Figure 7:
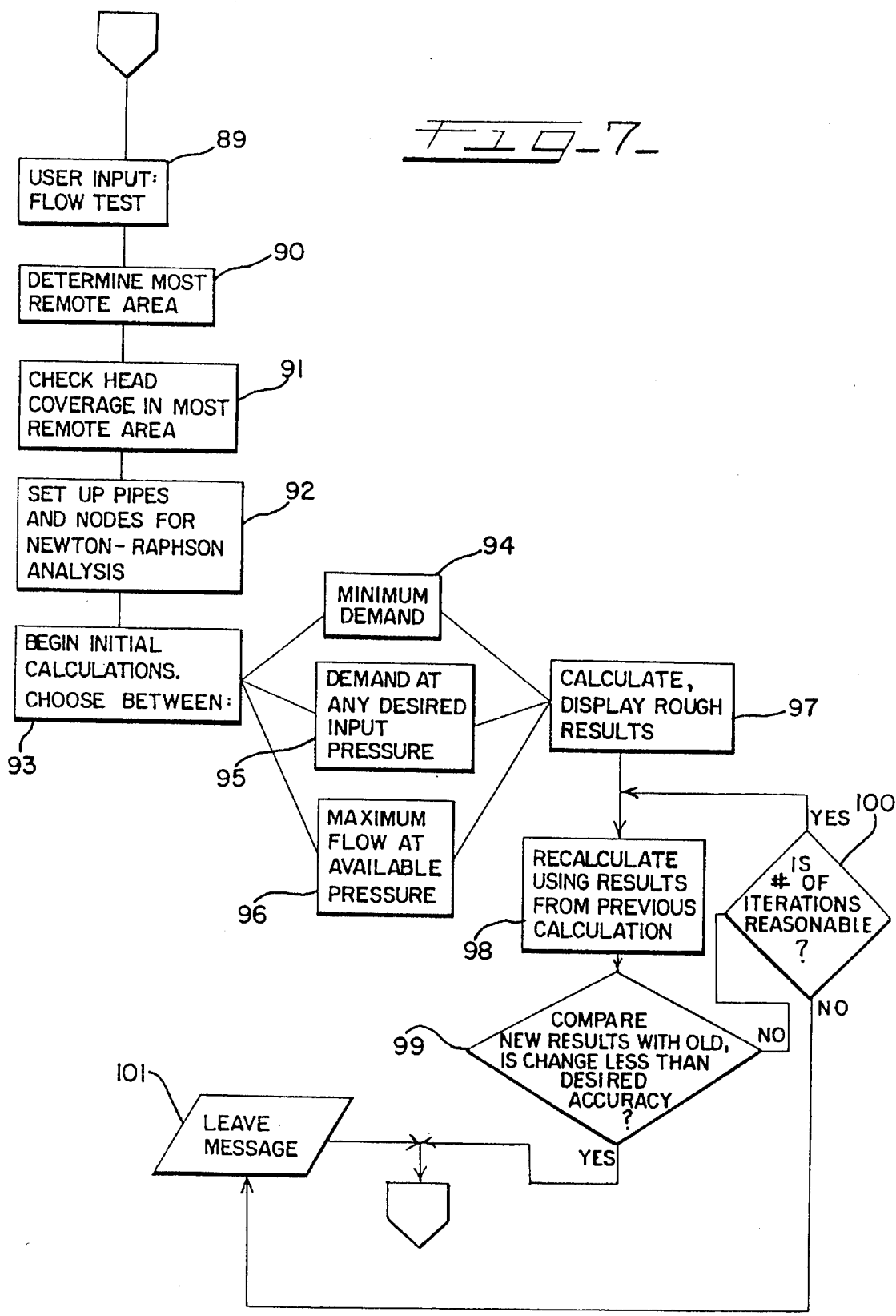

In FIG. 7, blocks 89 through 101, the computer evaluates the hydraulics of the system to be assured that the computer designed system will provide adequate coverage in the event of a fire. The user selects which type of flow test it is going to be using. Those two main analytical methods are the Hardy Cross and the Newton-Raphson methods. These have been described in the earlier embodiment.

Figure 8:
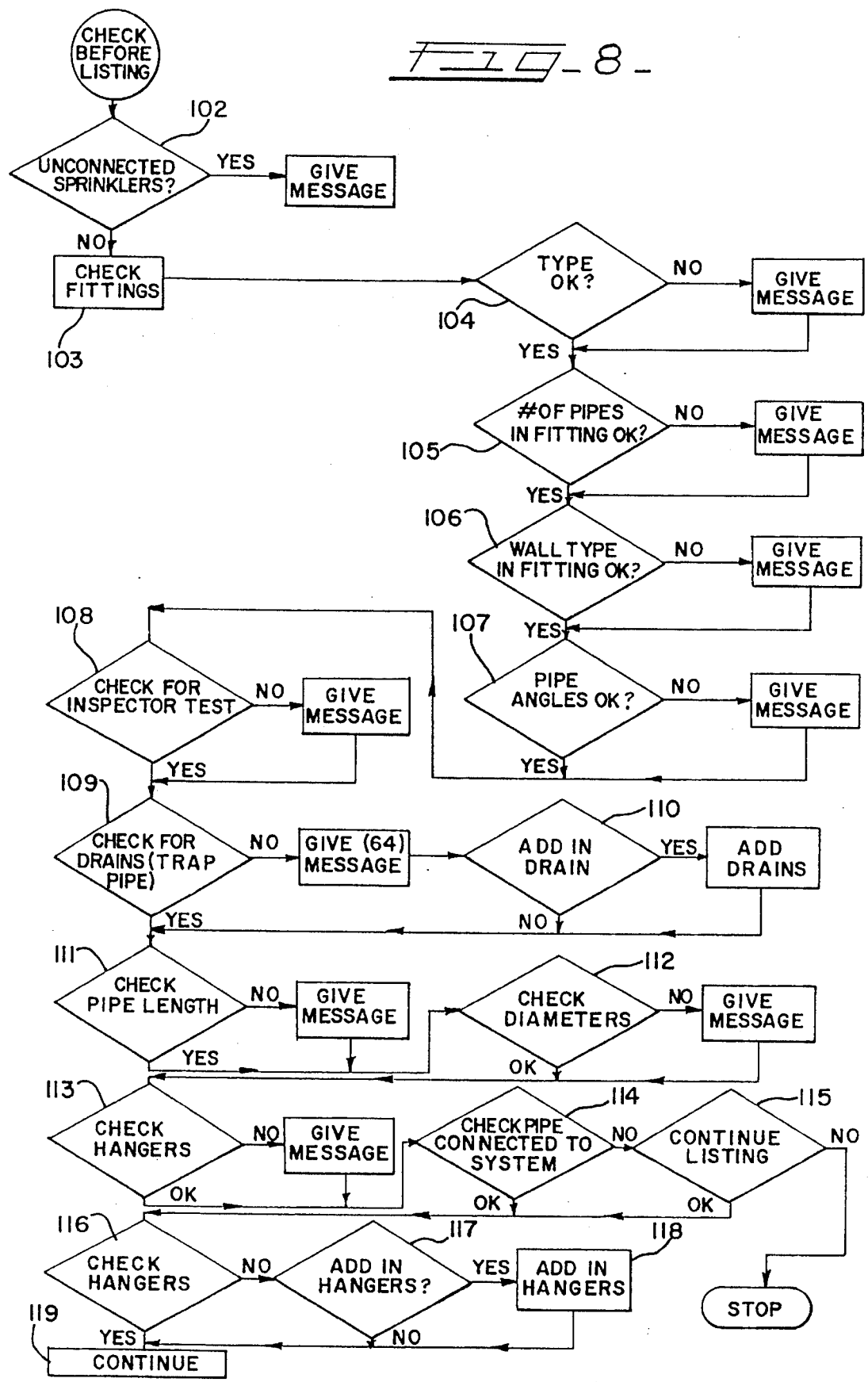
Figure 9:
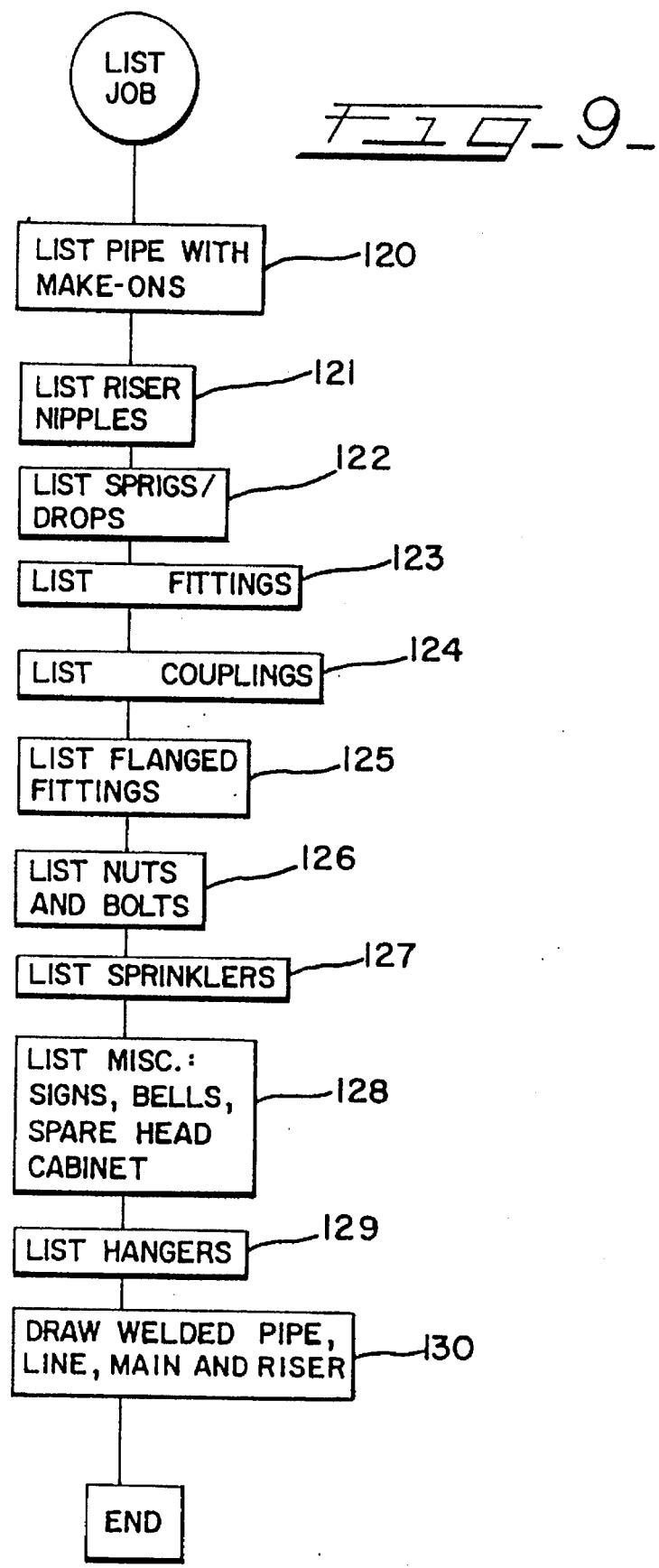

Lastly, FIGS. 8 and 9, show where the computer will actually print out and list all of the elements needed to complete the job.

In blocks 102–119, the computer now runs a check on the heads looking for unconnected piping or sprinklers. If it finds any unconnected heads, a message is given to the user. This can occur only if a user manually edited a system and ignored numerous messages.

In blocks 104–107, the computer now checks the fittings to be sure that the fittings will connect all pipes together. The computer checks the piping types and, it also checks to makes sure the number of pipes going into a particular fitting is adequate. For example, in a tee-fitting, the computer will check to be assured that three pipes are coming into a particular tee-fitting. The computer checks that the wall thickness in a fitting matches to the pipes and it also finally checks to make sure that the pipe angles match. If any of these tests show a problem, a message is given to the user.

The computer will check for drains in any trap pipes and will add them if needed. The computer will check the length of the pipes and the diameters of the pipes to be sure they are adequate and that the piping matches. Finally, it will check the type and number of hangers to be assured they are adequate to support the system. If necessary, the hangers will be added. Once all of these tests are done, the computer will list the job. It will first go on and list the pipe in block 120 with instructions as to how to make on the pipe fitting. In block 121, it will list the riser nipples needed. In block 122, it will list the sprigs needed for the system. It will list all the fittings and couplings necessary to put the system together. It will list all the nuts and bolts. It will list the heads and it will list the signs, bells and spare heads necessary for the system. Lastly, the number of hangers will be listed out.

The final step in block 130 is to draw the piping for the entire system. This drawing consists of a blueprint or other layout design to show all or selected elements for a stock list for a particular system.

The major difference between the more detailed description shown in FIGS. 1–9 and the earlier summary description is the method in which the location of heads and lines are computed in the earlier system, the lines are located first and then the heads are added on to that particular system. In the detailed description described in FIGS. 1–9, a line is added followed by the heads for that particular line and then a subsequent line is added followed by the heads for that subsequent line and so on until all lines and heads are cited. In still a third embodiment, not described, is to locate all heads first and then connect these heads with lines. In all of these cases, the mathematics is roughly similar and anyone skilled in the art would be able to interchange such systems at will.

FIG. 10 illustrates a combined warehouse and office space having a sprinkler system designed by the present invention. The building elements which must be avoided can be seen as the beams 126, the columns 127, the joists 128, and the outside walls 130. The building adjuncts which must be avoided are structures such as the lighting fixtures 131, the interior walls 132 the HVAC duct work 133 and the warehouse lighting fixtures 134. The designed sprinkler system begins at a water stub-in 135.

The water stub-in is connected via mains 136. The mains then connect to the individual lines 137 which, in turn, connect to the individual sprinklers 138.

The sprinkler system is relatively simple to design in the large open spaces of a warehouse.

The computer essentially starts near wall 140 and locates a line 137 as described above. The next line 137 is positioned at twice the distance first line 137 is from the wall. The same procedure of spacing is used to locate the sprinklers 138 positioned along each individual line 137. The lines are connected to the mains at positions 141. The lines 137 feed directly from the mains 136 which in turn feed directly from the water stub-in 135. The major structural elements or adjuncts which the sprinkler must avoid are the overhead lights 134, the joists 128 and the beams 126. However, these spaced in a predictable fashion and are relatively easy to avoid.

Contrast this with the office space 142. The interior walls 132 make positioning the sprinkler system much more difficult. There are other obstacles such as the HVAC system 133. This makes the computations much more difficult. For example, each individual closet space 143 will need its individual sprinkler and the supporting lines and mains. Free standing walls 132 also cause problems because they interrupt the straight lines and easy flow found in the warehouse 139. The sprinklers need to be interrupted and adjusted to fit into these particular areas. The present invention does these adjustments automatically.

An editing system can be included with the program. The editor will allow a user to alter the system as desired and will perform the checks described to prevent inadvertent standards violations. The user starts in the editing menu shown in FIG. 11.

The user may elect to edit portions of either the distribution system (HVAC, Sprinkler System) or the structural elements and adjuncts of the building. Changes in both areas are common occurrences. For example, a user may be asked to amend the distribution system by adding sprinklers in a certain room because the building owner may desire protection in that room above and beyond that called for in the relevant code.

Another common occurrence is the rearrangement of an office layout when the tenants change. The rearrangement may require the redesign of the sprinkler system as walls and rooms are moved, added or deleted. The present invention allows a user to enter such changes to the structural elements and then amend the sprinkler system for code compliance quickly and efficiently.

Figure 11:
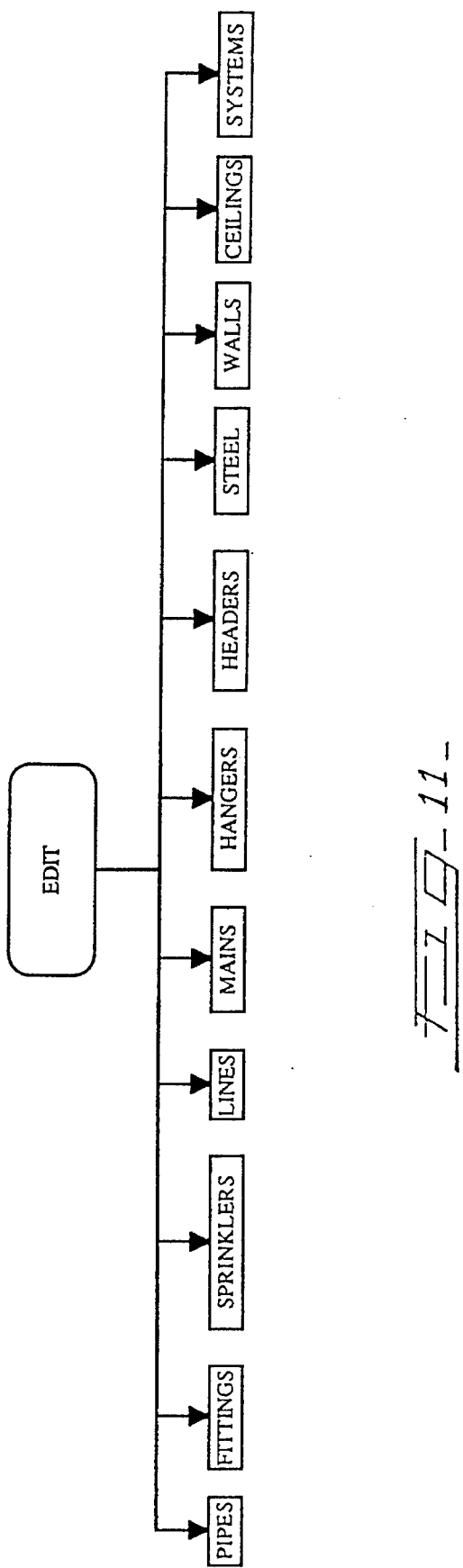
FIG. 11 represents the editing menu used in the present invention.

In the preferred embodiment, the user selects the particular item for which change is desired from the edit menu seen in FIG. 11. Each such item has a submenu as shown in FIGS. 12 through 21.

In general, the editing functions operate by first obtaining the element in the distribution system to change as well as the proposed change. Generally, this information is obtained from a user through a keyboard, a mouse or other standard input devices. The process then finds or determines the dimensional requirements of the proposed change by reference to the first memory means.

Checks are then performed based upon the dimensional requirements of the proposed change, the designed layout as well as reference to the standards for the distribution system. The checks can be obstructions analyses relating to building elements and adjuncts as well as the other elements of the distribution system itself, hydraulic analyses, or requirements analyses, such determining that a given pipe can accommodate a proposed fitting.

If the checks are satisfactory, the proposed change is made and adjustments are made to accommodate the change. These adjustments are typically made to hangers, pipe lengths and wall types.

If, however, the checks indicate that the proposed change is not satisfactory, the editing function will generate an error message.

Once all the editing is complete, a hydraulics analysis as described earlier is run to be certain the distribution system will perform. If satisfactory, an elements listing and revised layout are generated.

Figure 12:
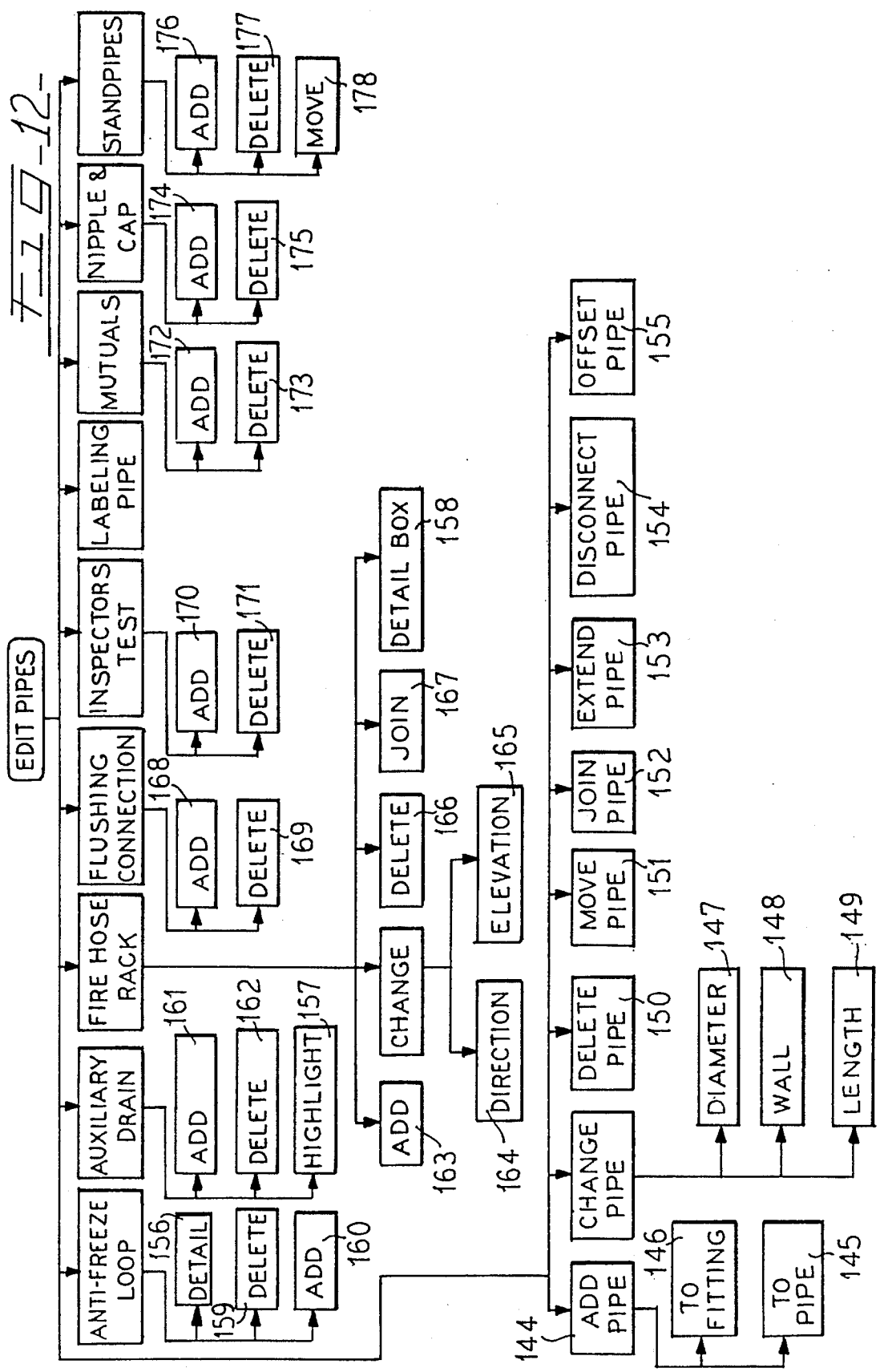
FIG. 12 represents the editing pipes submenu of the preferred embodiment.

FIG. 12 shows the menu for editing the pipes. As shown the preferred embodiment includes a multiplicity of choices for editing pipes. Selecting any of these choices brings you into actual operation of the program.

To add pipe 144, the user selects this option from the editing pipes submenu. The user must select a fitting to add to the pipe. To add this fitting to a pipe 145, a user must select where on the pipe the fitting is to be positioned. A check is made on this location to determine if the selected fitting can be added. If the fitting is so close to another fitting such that no piping can connect the two fittings, a message is generated and the subroutine terminates.

If the fitting can be added, it is. On the other hand, if a new fitting is added at the location of an old fitting 146, the old fitting is simply replaced.

A check is made to determine what direction that pipe can be added to the selected fitting. For example, adding a T-shaped fitting to the middle of a length of pipe restricts the possible directions of an added pipe to a plane which is perpendicular to the pipe at the proposed fitting.

The program gets the direction, length and pipe type and diameter for the added piping. A new fitting is then located at the end of the added pipe opposite the existing piping. A check is made to determine if the added pipe and the new fitting will intersect any of the structural elements and adjuncts or the elements of the distribution system. If it does, the user can optionally terminate the addition.

The fittings and the pipe therebetween are then added to the distribution system as well as any hangers and adjustments to fittings needed. The program can loop back and add pipe from the new location if desired.

The wall type 147 and diameter 148 of a pipe can be changed and all related changes are performed automatically. For example, new fittings, hangers and cut lengths are determined. Such automatic changes are also made when any element of the distribution system is changed.

The length of a pipe can be changed 149 by selecting which pipe to change and which fitting to move. The desired change can be entered as either directly to the cut length of the pipe or as the distance from a center of one fitting to the center of the second fitting. The distance and direction of the proposed movement are obtained from the user.

A check is automatically performed to see if the selected fitting can be moved as desired. The checks are to be certain that the fitting is not moving through another fitting and that other pipes attached to the fitting are also movable. If the fitting cannot be moved, the user is informed and the subroutine terminates.

If the fitting can be moved, the hangers are deleted, the fitting is moved, the pipe length is adjusted and the hangers added back to the distribution system. The change is then complete.

Piping can be deleted 150. A pipe is selected and then the hangers and the pipe itself are removed form the line and the database. The pipe is disconnected from the appropriate fittings which are then adjusted or deleted accordingly. If the pipe is the last pipe for a given line, the line itself is also removed.

A pipe can be moved 151 if desired. The directions that the pipe can be moved are determined and a specific direction and distance are selected. A check is made to determine if relevant fittings can be moved as described previously. If not, the user is informed and the subroutine terminates.

If the pipe is movable, the hangers are deleted, the pipe is disconnected from the fittings, the fittings are moved, the pipe is moved, the fittings are reconnected and the hangers are added back in.

Two pipes can be selected and joined together 152. If the pipes are parallel, the X, Y location of either end of one of the pipes must by located between the ends of the other pipe to join. If not, a message is given and the subroutine terminates.

If the pipes do overlap, then the location to join the pipes is determined. If the pipes are at differing elevations and if the pipes we are joining are two mains, the one sloping pipe is used to join. Otherwise, one Z-axis pipe and one level pipe are used to join the two pipes.

If one sloping pipe is used, couplings are added to each pipe, the pipe type and diameter are selected and the pipe is added in between the couplings. If two pipes are used, couplings are positioned on each pipe and at the location in which the two new pipes will meet. The pipe diameter and types are related and the pipes added between the couplings. In both the one pipe and two pipe options, the fittings, hangers and cut lengths are adjusted accordingly.

If the pipes are not parallel, they are perpendicular and a check is made to see if they cross each other. The two ends of each pipe are checked to determine if they fall on opposing sides of the other pipe.

If the pipes do cross, fittings are added at the crossing points on both pipes. If the fittings are abutting, fittings are joined. If the fittings are not abutting, pipe is added therebetween to join the fittings.

If the pipes do not cross, the pipes with the least slope is extended until the pipes do cross. Then the procedure is as discussed above for crossing pipes.

In all cases, a final adjustment is to the fittings, hangers and pipe lengths before the subroutine ends.

A pipe can be selected for extension 153. A fitting and a direction to extend are selected. A check is made to be certain that pipe can be added to the selected direction. If a pipe already extends from the fitting in that direction, another cannot be added. Also, a proper fitting must exist to allow the desired extension. If not, a message is given to the user and the subroutine terminates.

The distance and final location at the extended pipe end is determined. If the fitting is a cap, then the hangers are removed, the cap is moved and the hangers are simply replaced. If the fitting is not a cap, a fitting is positioned at the extended pipe end, piping is added between the fittings, the fittings are adjusted and hangers are added.

A pipe can be selected for disconnection 154 from a fitting. A check is made to determine if one or two pipes are found at the particular fitting. If only one, the pipe cannot be disconnected as the fitting would be left with no piping. If two, a cap is added at the same location as the fitting. The selected pipe is disconnected from the old fitting and the cap in connected to the remaining pipe. The old fitting is adjusted as needed as well as the length of the remaining pipe.

A pipe can be offset around a beam 155. The pipe to be offset is selected and the intersecting beam is formed. If no such beam is found, the subroutine automatically terminates. The location on the piping on either side of beam to be offset are found.

Couplings are added at both such locations. The distance that the pipe needs to be offset is also found. The line is then moved between the couplings this distance. A plug is added to one of the fittings and final adjustments are made to the fittings, the cut length of the pipes and the hangars.

Detail boxes can be inserted or highlighted in the drawings for various portions of the distribution system. Such portions can include an anti-freeze loop 156, an auxiliary drain 157 and a fire hose rack 158.

The anti-freeze loop and its detail box can be deleted 159. The starting and ending fittings are first determined and all other lines connected to the loop are deleted. The line for the loop is determined and each pipe of the line is deleted until none remain. The starting and ending fittings are then connected and the standard adjustments to the fittings, the pipe length and the hangars are made.

Of course, an anti-freeze loop can also be added 160 to the system. The starting and ending locations for the loop are obtained. A check is made to certain that enough room exists for the loop. If not, the program terminates.

If there is enough room, couplings are added to both the starting and the ending location. The pipe between the starting and ending locations is deleted.

A location is found to position a control valve on the pipe connected to the starting location. A coupling which is later changed to a control valve is added. The hangers and the pipe lengths are adjusted.

At the starting location fitting, a pipe is added two inches (5.0 cm) up from the fitting and a globe valve is positioned on the end of this pipe. A pipe is extended two inches (5.0 cm) from the globe valve and a fill cup is positioned on the pipe.

At the starting location fitting, a pipe is added to extend one foot (30.5 cm) down from that fitting. A weld tee is added to the end of the one foot pipe. The fittings and cut lengths are adjusted.

A nipple, a three-inch (7.5 cm) pipe, comes out of the weld tee. A second globe valve is added at the nipple's end. A plug is added to the globe valve and the nipple's cut length is adjusted.

A pipe is added to be four feet (1.2 meters) down from the weld tee. A second weld tee is added at the end of the four foot pipe. Again, a nipple is added to the weld tee with a globe valve and plug. The nipple length is adjusted.

The bottom of the loop is determined. A pipe is added for the weld tee to this location. An elbow is added to the end of this pipes and the pipe's length is adjusted. Also, a location is determined for a check valve. Piping is added to this location from the elbow and the check valve added to the end of the pipe.

Lastly, a location is determined to rise up to the ending location. Again, pipe is added to the rise up location from the check valve. An elbow is positioned at the end of the piping and the standard adjustments made. A drain is positioned at the elbow. The end location fitting and this elbow are connected with a pipe. Again the standard adjustments are made.

A drain can be added 161 to the distribution system. If the distribution system is a dry system which will trap more than five gallons (19 liters) of water, a condensate valve will be added.

If the drain is to be added to a fitting, that fitting is simply selected. If the drain is to be added to a pipe, a location on the pipe must be selected and a coupling added to that location. A direction to add the drain is obtained.

At the selected fitting, a one-foot (30.5 cm) pipe is added in the chosen direction. A new fitting, a globe valve, is added to the end of the one-foot (30.5 cm) pipe. The length is then adjusted downward to three inches (7.5 cm).

If the system is a dry system with more than five gallons (19 liters) of trapped water, a one-foot (30.5 cm) pipe, one inch (2.5 cm) in diameter, is added to the globe valve. A coupling is added to the end of this pipe and the length adjusted to three inches (7.5 cm).

Another one-foot pipe (30.5 cm) with a two-inch (5.0 cm) diameter is added to the screwed coupling. Again, a screwed coupling is added to the end of the two-inch (5.0 cm) pipe and the cut length is adjusted to one foot (30.5 cm). A one-inch (2.5 cm) diameter pipe is added to the screwed coupling. A globe valve is added to this pipe and the length of the pipe adjusted to three inches (7.5 cm).

In all cases, a plug is added to the globe valve which is at the end of the piping. A note is added to the drawing relating to the added drain.

A drain can be deleted 162. The desired drain is selected and a check is made to confirm that the selected fitting is a globe valve with a plug and that it is therefore a drain. If it is, the drain is changed to a sprinkler and then deleted.

The drain in the distribution system can be highlighted or not highlighted 157. A check is made of each fitting in the distribution system to determine if it is a drain and that it is connected with pipe to the distribution system. If it is a drain, it is highlighted or not highlighted as selected. The drains in the distribution system are also counted.

A fire hose rack can be added 163 by selecting a location which will then be adjusted to correspond to the nearest column. If the building has more than one distribution system, pipe is obtained to connect the location to the other systems. Otherwise, the closest main is selected for connection.

The direction, the elevation of the fire hose rack and the elevation at the top of the drop are obtained. A fitting is then added at the top of the drop. A tee is added at the elevation for the hose rack.

One inch (2.5 cm) pipes are added to both the drop fitting and the tee. A pipe is also added to the tee in the direction of the fire hose rack. A hose unit is added at the end of this pipe. The cut length is also adjusted to three inches (7.5 cm).

A six-inch (15.25 cm) downward extending pipe and a cap for the pipe are added from the tee. The top of the drop is then connected via a pipe to the tee. The elements of this pipe, the associated fittings, cut lengths and hangers are all adjusted. A detail box can be added to the drawings if desired.

The direction of the fire hose rack can be changed by simply selecting the new direction 164. The piping and the hose unit at the old location are deleted while the new pipe and hose unit are added. A similar adjustment can be made for the elevation of the fire hose rack 165. However, a check is made to be certain that the new elevation is not above the pipe at the top of the fire hose rack.

The fire hose rack and its associated detail box, if any, may be deleted 166 by simply by selecting it. The fire hose rack is changed to a sprinkler and simply deleted.

A fire hose rack may be joined 167 to a distribution system. The fire hose rack to be joined is first selected. If more than one system is in the distribution system, a pipe in another system is selected for joining, else a pipe in the current system is selected. The location on the pipe to join is chosen and the two pipes are joined.

Flushing connections are added 168 by selecting a fitting. A check is made to be certain that the selected fitting has a cap and is on a main. The cap is extended one-foot (30.5 cm) form the fitting where the appropriate coupling is substituted for the cap. A two-inch (5.0 cm) pipe is added from the coupling to the cap. The cut length of this pipe is adjusted to six inches (15.25 cm).

The deletion of a flushing connection 169 is the reverse of the above. In essence, the pipe and coupling are deleted while the cap replaces the coupling. Of course, appropriate checks are made to be certain that the desired deletion really is of a flushing connection.

An inspector's test connection can be added 170 to the distribution system. Again, either a fitting is or a location on a pipe is selected. If a pipe, the appropriate fitting is added at the chosen pipe location. A check is made to be certain a coupling can be added at the selected location.

A wall, preferably an outside wall, is selected for the test connection to extend through. A one-inch (2.5 cm) diameter pipe is added from the fitting to wall. A location for a globe valve is chosen and a one-inch (2.5 cm) pipe added from fitting to that location. A globe valve is then added.

A location for an elbow at the end of a drop is chosen and a pipe is added from the globe valve to that location. An elbow is added to the end of the pipe.

A location for a smooth bore outlet is selected on the outside of the selected wall and a pipe added from the elbow to that location. The smooth bore outlet is added at the end of this pipe. The pipe through the wall will be denoted as being galvanized.

To delete the inspector's test connection 171, the smooth bore outlet is found and deleted after being converted to a sprinkler.

A mutual can be added 172 to the system. First, a pipe for the mutual must be selected as well as two fittings for the mutual. One of the fittings must be an elbow with a drop. The location of the other fitting is saved while the pipe is disconnected from the fitting.

A new location is found for the pipe which determines the distance to move each fitting on that pipe. The fittings are then moved and a pipe is added to connect the moved pipe with the saved fitting. The deletion of a mutual 173 is the reverse of the above process.

A nipple end cap combination can be added 174 to an existing fitting if steel is found nearby. The direction to add is found and checks are made to determine (1) if the fitting type is appropriate and (2) that no existing pipe prevents such an addition.

A location and distance are found to add the nipple and the cap. A pipe is added from the fitting in the found direction and to the found distance and a cap is added at that location. All standard adjustments are performed. Again, the deletion of a nipple and cap 175 is simply the reverse of the above procedure.

Standpipes can be added 176 to the distribution system. The location of the standpipe is obtained as well as the number of floors within the building. A floor, its elevation and the elevation for a hose valve are obtained.

If a first floor standpipe is to be added, an elbow is mounted at that location and elevation and a hose valve added to the elbow. If other than the first floor, a tee is added at the hose valve elevation and a pipe added from the tee to the previous fitting (tee or elbow). A hose valve is added to each such tee. The pipe length is adjusted and hangers added. This procedure is repeated until the top floor is reached.

On the top floor, a pipe is added up from the tee and a weld tee added to the top of this pipe. A pipe and a cap are added up from the welded tee. Also, a pressure gauge is added to the welded tee. All standard adjustments to fittings, pipe cut length, diameter and wall tape end hangers are performed.

The deletion for the standpipe 177 is simple. The standpipe line is selected and deleted in its entirety.

To move a standpipe 178, the distance and direction are first obtained. Then each pipe and its associated fittings are moved the chosen distance and direction until all such pipes have been moved.

Figure 13:
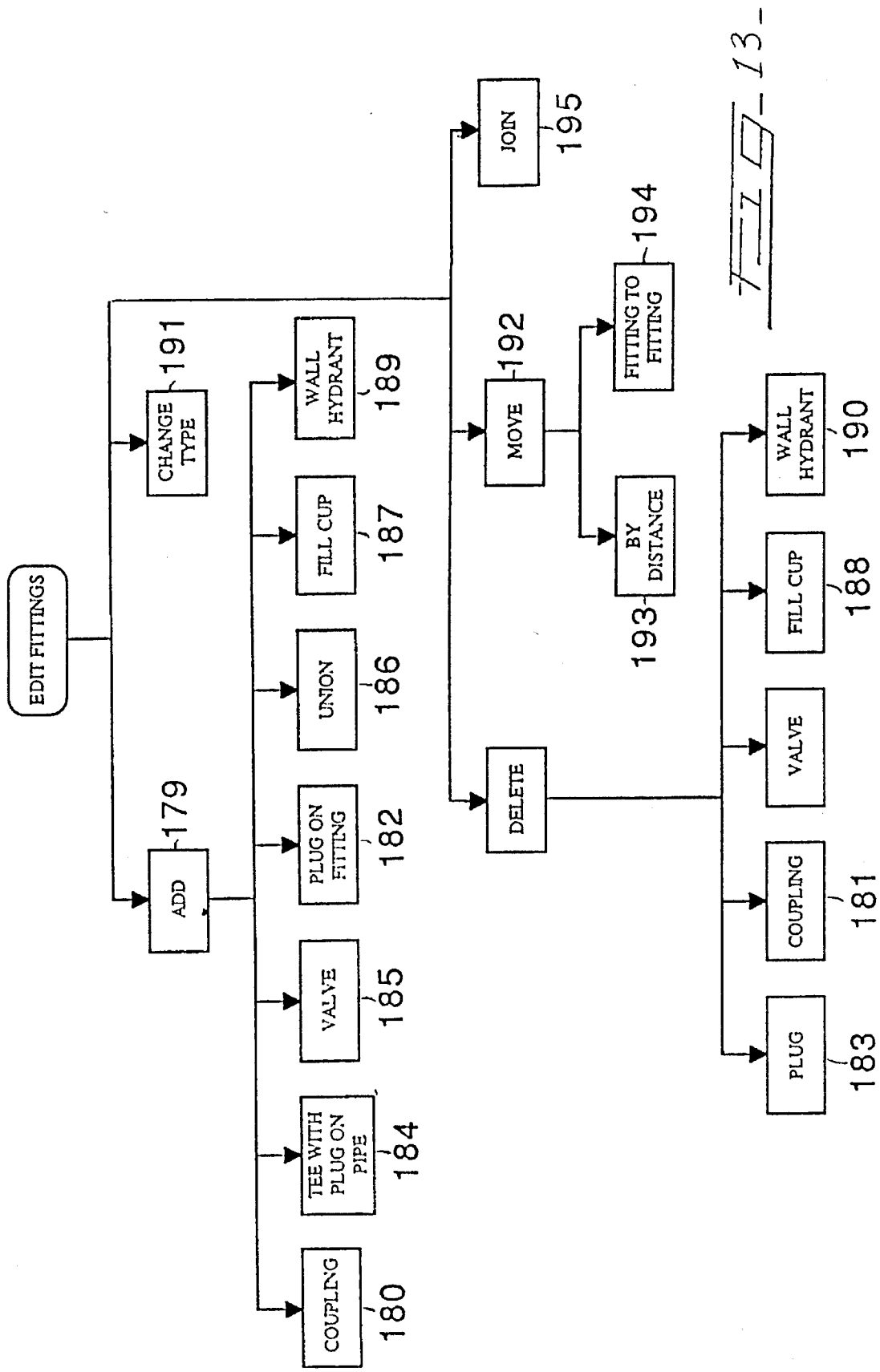
FIG. 13 represents the editing fittings submenu of the preferred embodiment.

FIG. 13 shows the menu for editing the fittings. As shown therein, it is seen that the preferred embodiment includes a multiplicity of choices for editing fittings. A user simply selects any of these choices as desired.

To add a coupling to a pipe 179, the pipe and the proposed location on the pipe for the coupling are obtained 180. At that point, the line the pipe is in is found as well as the fittings at either and of the pipe. All the hangers for the pipe are then deleted.

A new coupling is added at the chosen location. A pipe is disconnected from one of the end fittings and extended to the added coupling. A new pipe connects the other end fitting with the added fitting. The hangers are replaced and adjustments are made to the fittings and the length of the old and new pipes as needed. Reversing the above procedure will delete a coupling 181.

Addition of a plug to a fitting 182 is simple. The fitting is chosen as well as the plug's direction. The plug is added and appropriate adjustments made. The reverse holds true for deleting a plug 183.

A tee with a plug can be added to a pipe 184. The pipe is selected as well as the location for the tee. The tee is added as any fitting would be (see above) and a plug added to the tee.

A valve can be added to a pipe 185 by adding a fitting to the pipe as described previously. The fitting is then changed to a valve and adjustments made to the pipe wall and the length of the pipe. The procedure for adding a union 186 is identical except the fitting is changed to a union.

A fill cup can be added 187 to a cap or a coupling by selecting the particular fitting and the direction to add. A globe valve is added to the fitting. A two-inch (5.0 cm), long pipe is added to the fitting in the selected direction. A fitting is added to this pipe and a fill cup added to the fitting. A check is made to be certain that the fill cup is added to the globe valve. To delete a fill cup 188, the chosen fill cup is changed to a sprinkler and the sprinkler is then deleted.

A wall hydrant can be added 189 to a selected fitting or a main. An outside wall must be available which to add the wall hydrant to or else the subroutine terminates. A direction is chosen and is also checked to be certain that pipes can be added in that direction.

A location inside the chosen wall is obtained for a drop and for a control valve. A pipe is added from the chosen fitting to the drop location. An elbow is added to the end of the pipes and adjustments made to the fitting and the pipe length while hangers are added.

Pipe is added from the elbow to the control valve location. A control valve is added at that location and the pipe length is adjusted. Another elbow is added to the control valve.

Pipe is added from the second elbow to the wall hydrant location and a wall hydrant is added. A ball drip is added to the lowest elbow elevation. The pipe lengths are adjusted accordingly.

The wall hydrant is deleted 190 by determining the wall hydrant to delete and finding the point on the main to stop. The components are deleted one by one from the wall hydrant to the main.

A fitting can be selected and changed 191 to a new type of fitting. All pipes connected to the old fitting are adjusted to accommodate the new fitting.

A fitting can be moved 192 by either obtaining the direction and distance to move 193 or obtaining the fitting to move towards 194. If the second option, the distance and direction are determined by the relative positions of the stationary fitting and the fitting to be moved.

All hangers are deleted and the new location of fitting determined. The fitting is moved along with any pipes in the fitting. All pipe lengths in the fitting are adjusted and the hangers are then replaced.

Two fittings can be chosen for merger or joining 195. If the fittings are in the same location one is deleted. Pipes which connected to the deleted fitting are then connected to the remaining fitted and adjusted accordingly.

If the two fittings are separated, a pipe is added to join them. The two fittings, the wall type and length of the pipe are adjusted and hangers added.

Figure 14:
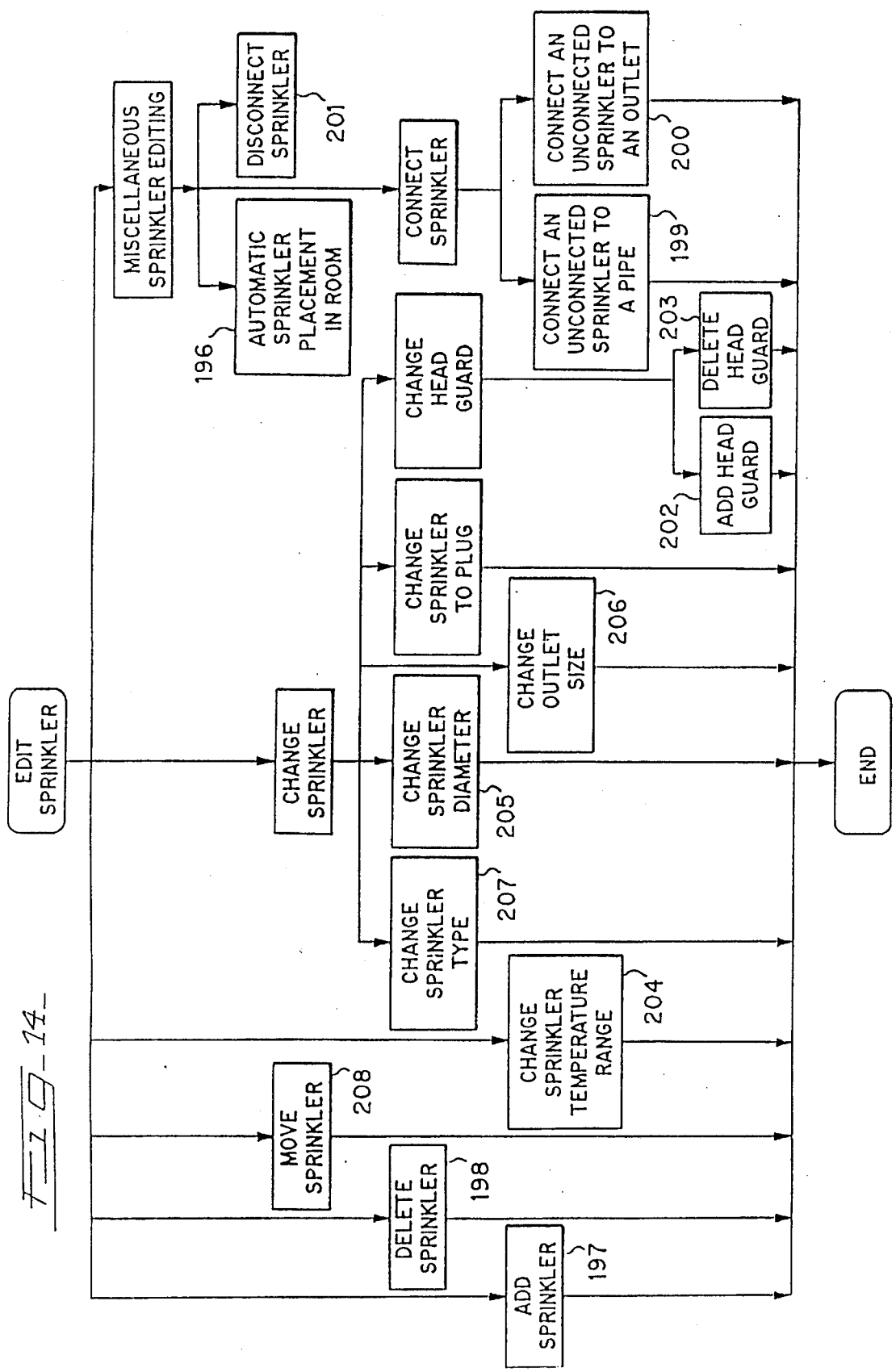
FIG. 14 represents the editing sprinklers submenu of the preferred embodiment.

FIG. 14 shows the menu for editing the sprinklers. As shown therein, it is seen that the preferred embodiment includes a number of such options. Selecting any such option bring forth the desired subroutine.

This submenu includes a subroutine which allows the automatic placement of sprinklers in an office 196. This feature is useful when office space is redesigned to accommodate a tenant. The new office room is first selected together with the hazard type of the room. Information relating to the orientation and positioning of the room's walls is thereby obtained.

If the room is not a simple-shape which are defined as squares, rectangles or trapezoids, it is divided into a minimum number of sections which are simple-shaped. If such an automatic division is not possible, the division can be done manually. If the room itself is simple-shaped, then it is also divided into subsections. A simple-shaped section is selected to begin. The subroutine will repeat until no such sections are found.

The program will place the sprinklers in the center of a ceiling tile if available. The distances between extreme left and extreme right and extreme front and extreme back points are determined. These distances yield the area of the simple-shape section.

The distances determined above, the section area and the hazard type of the room are compared with the appropriate regulations to determine the number of lines needed in the simple-shaped section, the distance between the lines and the distances between the sprinklers. The sprinklers are then positioned to be free of building adjuncts. The locations and distances are checked for compliance with regulations and adjusted if needed.

A sprinkler can be added 197 to the distribution system by three separate paths. First, a sprinkler can be added to fitting. A check is then made to determine whether a sidewall, upright or pendant sprinkler is appropriate. The selection is made from the acceptable types and the selected types are installed.

If a sidewall sprinkler, a further check is made of the possible directions to add and one possible direction is selected. If a pendent sprinkler, a further check is made to see if a suspended ceiling led to this choice. All fittings are adjusted as needed.

A sprinkler can be added directly to a pipe. As is normally the case, the location on the pipe is determined and a fitting added thereto. The sprinkler's type and elevation are determined in view of any suspended ceiling and the elevation of the pipe.

The sprinkler is then positioned of the desired location. A check is made to determine if the sprinkler location matches the pipe's location. If not, pipe is added and the standard adjustments are made. If the locations are the same, no pipe is added and only the fitting is adjusted.

A twist to these situations occurs when placing a sprinkler under an overhead door. The overhead door is selected as well as a location for a drop. A check is made to determine if another door is within a certain distance which is dependent on the relevant standards. If no such nearby door is found, the drop is six inches (15.25 cm) from the door. If a second door is nearby, the drop is placed midway between the two doors.

The closest pipe and the nearest point on this pipe to the drop are determined. A coupling is added to the pipe at this location. A first fitting is positioned at the X, Y location of the drop but at the elevation of the coupling on the pipe. The coupling and the first fitting are joined as described above in joining fittings.

A second fitting is added eight inches (19.3 cm) below the door. The first fitting is also corrected and adjusted with a pipe. If two doors are involved, two more fittings are positioned six inches (15.25 cm) from each door's edge and eight inches (19.3 cm) under it. If only one door, a third fitting is added six inches (15.25 cm) from the door edge and eight inches (19.3 cm) under it.

The new fitting(s) situated under the doors is connected to the second fitting with pipe. All the fittings are adjusted. A side wall sprinkler then is added to any under-door fittings.

Sprinklers can be deleted 198 from the system. If pipes exist solely to connect the sprinklers to the distribution system, they can also be deleted if so desired.

An unconnected sprinkler may be connected to a pipe 199 or an outlet 200. First, a check is made to determine if the sprinkler is unconnected. If it is, it is then deleted from the distribution system. A sprinkler of the same type, diameter and direction is then added to either the pipe closest to the original location or to an outlet which is altered to be a regular fitting.

To disconnect a sprinkler 201, a check is first made to be certain the sprinkler is indeed connected. The fitting the sprinkler is connected to is determined and the sprinkler is then disconnected therefrom. The fittings are adjusted as needed. Alternatively, the sprinkler can simply be changed to a plug.

A head guard can be added 202 to an existing sprinkler if one is not present. Of course, a head guard can also be deleted 203 if the sprinkler already has one. A sprinkler's temperature range 204 and diameter 205 can also be altered.

A sprinkler's outlet size can be changed 206 to a different valve if it is not connected to the line by a vertical pipe and is connected by either a bushing or a standard fitting.

If the sprinkler is connected to the line by a bushing, a check is made to determine if the new outlet size is the same as the sprinkler's diameter. If it is, the bushing and the old sprinkler are deleted and the new sprinkler substituted. If not, the bushings diameter is simply altered to fit the new sprinkler.

If the old sprinkler was connected to the line by a standard fitting, than a bushing of the appropriate diameter must be used to connect the new sprinkler.

A sprinkler's type can be changed 207 to a type different than the original. If the old sprinkler was attached via a vertical pipe, the location of the vertical pipe is obtained. If the new type is a sidewall sprinkler, the direction of the sidewall is also obtained.

If, however, the new type is not a sidewall but the old type was, then the pipe direction must also be obtained. Depending on the direction of the pipe, the sprinkler type is changed to either a pendant or an upright. The vertical pipe is also deleted.

On the other hand, if neither the new type nor the old type is sidewall, no other information is needed. The new location and type are obtained and assigned for the sprinkler.

If the sprinkler is not connected by a bushing or a standard fitting, then an error message is generated. If it is connected by a standard fitting, and the new type is a sidewall, the new location and type are obtained and assigned to the sprinkler.

If it is connected by a standard fitting and the new type is sidewall, the sidewall's direction must be obtained. If that direction is already occupied, another error message is generated. If it is not occupied, then a new location and type are assigned to the sprinkler.

A sprinkler can also be moved 208. If the sprinkler is unconnected either the new position or a distance and direction are given to move. The distance and direction are later converted to a new position. The new position is the assigned to the sprinkler.

If the sprinkler is to be moved is the X, Y plane, the distance to move is obtained. The sprinkler, its fitting and all other fittings between the old and the new position are moved.

If the sprinkler is to move in the Z-direction, the sprinkler's type is obtained and it is determined whether a vertical pipe on the sprinkler exists. If such a pipe is found, the direction of the pipe is determined. If the direction to move the sprinkler is the same as this direction, then the sprinkler is simply moved. If it is not, then the length of the vertical pipe is determined. If the distance to move is greater then this length, no move is allowed. If it is not, the sprinkler is moved as desired.

If no vertical pipe is found, then the sprinkler direction must be the same as the proposed move direction or a move is not permitted. If the directions are the same, any bushing is first deleted. The sprinkler type is saved and the sprinkler is then deleted and the fitting added to the location of the deleted sprinkler. A cap is added to the new location and the fitting and cap are connected. The fitting is adjusted and the sprinkler substituted for the cap.

Figure 15:
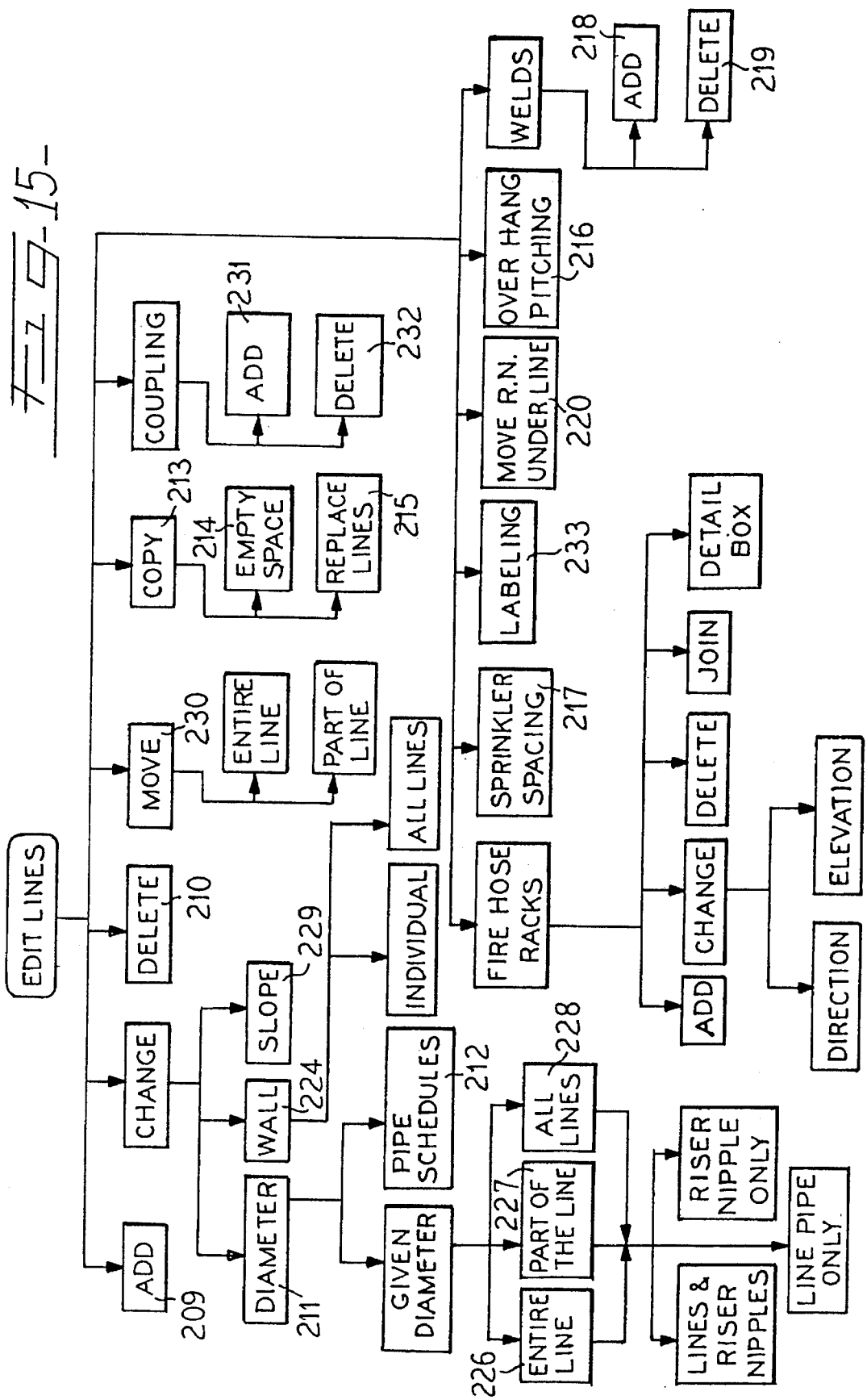
FIG. 15 represents the editing lines submenu of the preferred embodiment.
Figure 16:
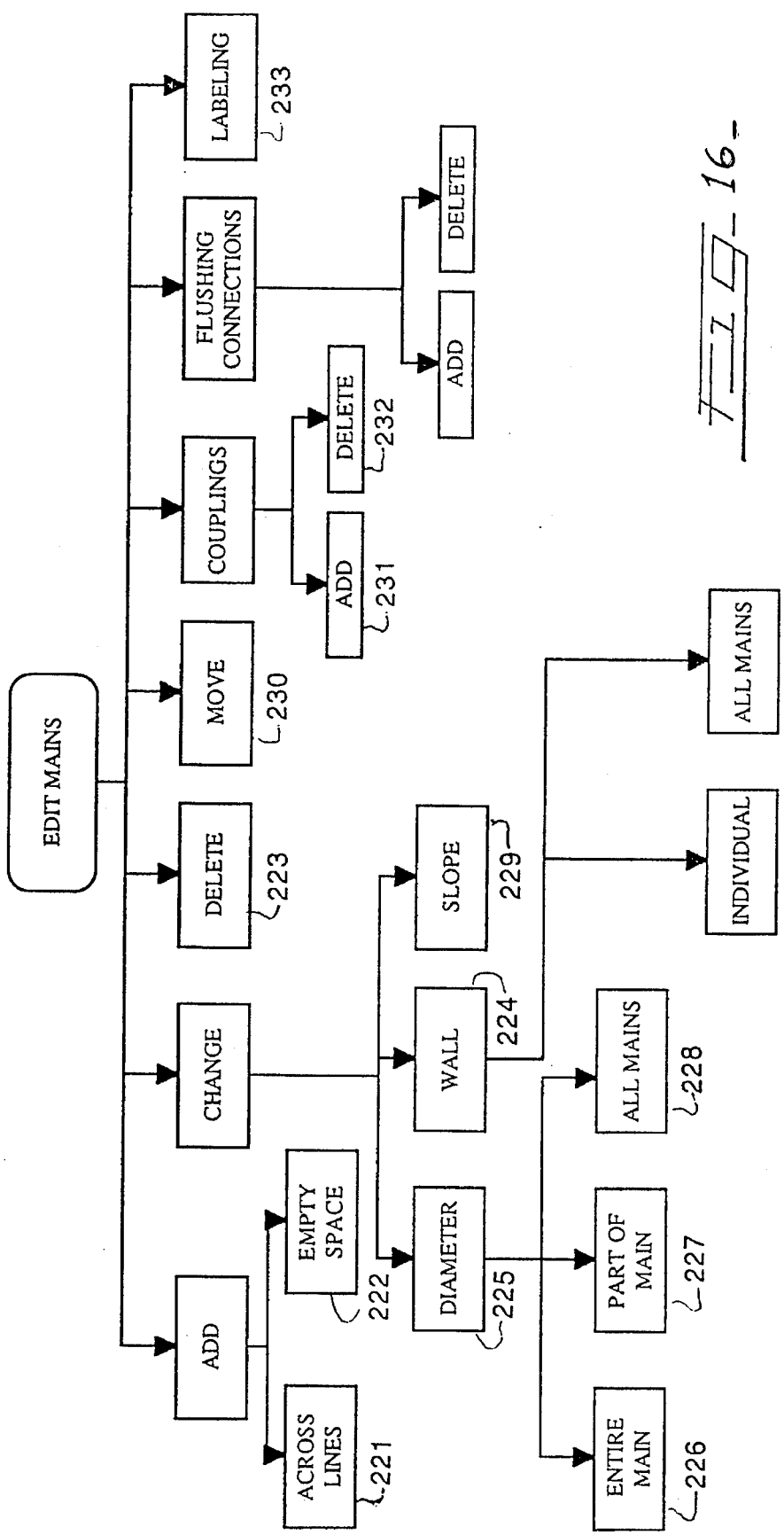
FIG. 16 represents the editing mains submenu of the preferred embodiment.

FIGS. 15 and 16 show the menus for editing the lines and the mains respectively. As shown therein, it is seen that the preferred embodiment includes a number of options for editing the lines and the mains in the system. Due to the similarities between lines and mains, many of the functions performed in each submenu are the same for both.

To add a line 209, the starting point and ending point for the line are obtained. Fittings are situated at both points and a pipe is added to connect the two fittings. This arrangement is a line.

A review of all piping is made to find a main that crosses the line. If no such main is found, the line can be completed but it will be unconnected. If such a main is found, the line will be connected to that main via a riser nipple which is adjusted appropriately. The program cycles until all mains which cross the line are found and connected with the line as described.

At this point, sprinklers can be added to the line if desired. The distance between sprinklers is obtained and the first sprinkler is positioned at the starting fitting. Subsequent sprinklers are spaced the obtained sprinkler separation distance until the end of the line is reached.

If the default for adding welds to the line is set, such welds are now added. Once the welds are added, or if the default is not set, the line is positioned at the proper elevation. A check is performed to determine if the line is hitting anything. It if is, a message to that effect is generated. Lastly, the hangers are added to the distribution system.

To delete a line 210, the line is first selected. A pipe in the line is found and deleted along with all the fittings on the pipe. This process repeats until no further piping is found.

The diameter of a pipe can be changed 211 by the pipe schedule 212 which is provided by the data base. A starting fitting, a direction to change and the type of schedule to use are selected. Beginning with the starting fitting, the pipe to be changed is marked as well as the fitting on the end opposite the starting fitting. If the second fitting is a sprinkler, it is counted. This process cycles until all pipes are found.

The process returns to the starting position and finds the current pipe diameter. The diameter is changed and the next pipe found. This process repeats until all diameters are changed.

A line can be copied to another location 213. The copying can be done to an empty space 214 or to replace an existing line 215. The existing line to be replaced is first deleted when the location for the copied line is found. The differences to move are calculated.

A pipe on the line to be copied is obtained as well as the fittings at both ends of the pipe. A check is made to determine if these fittings have already been copied. If not, the same types of fittings are situated at the new location.

Piping is then positioned between the two new fittings and adjustments made to the wall type and the cut length. The process repeats until the entire line has been copied.

Once completely copied, the riser nipples and the hanger are added. A check is made to be certain that the new line does not hit anything. If it does, a message to that effect is generated. The subroutine then terminates.

The overhang pitch of a line may be altered 216. The line and the fitting to change are obtained. The corresponding fitting on the main, the orientation and the amount to slope are then found.

The process then gets the line to slope. The two fittings to change are found and marked to the correct location for the chosen slope. The process iterates until no further pipes are found. The hangers and the pipe lengths are adjusted accordingly.

The sprinkler spacing on a line can be changed 217. The line, the location of the first sprinkler and the new desired spacing distance between sprinklers is obtained. A pipe on the line is found as well as fittings on both ends. If either fitting is a sprinkler, it is deleted. This process repeats until all sprinklers or the like are deleted.

A sprinkler is then added at the starting location and subsequent sprinklers are positioned on the line with the new spacing until the end of the line is reached.

If no welds exist in a line, they may be added 218. The line to add welds and the amount of welds allowed are obtained. Then, the first fitting is found and a determination made whether the fitting should be a weld fitting or not. If it is, it is changed to a weld fitting. The next fitting is found and counted and the process repeats until all the fittings are fully accounted for. Deletion of welds 219 is essentially the same process except all welded fittings which are found are now changed to non-welded fittings.

A riser nipple can be moved 220. The particular riser nipple to be moved is obtained as well as the fitting on top of it. The pipe which goes into the top fitting is also found. A check is made to be certain that this pipe is an arm over, otherwise the subroutine terminates.

A location on the main is found to which to move the riser nipple. A coupling is added at this location. The armover pipe and the riser nipple are then deleted. A riser nipple is then added from the top fitting to the main fitting and the riser nipple adjusted.

The editing of a fire hose rack to a line is identical to the procedures as described previously in connection with a pipe.

Turning now to some subroutines found only in the edit mains submenu of FIG. 16, one can add a main across a number of lines 221. The first line and the last line are obtained which allows the orientation of the mains to be found. The location on each line where the main is to connect is checked to be certain that the main can be added. The main must also follow either an X-axis or Y-axis orientation only. If suitable locations are not found, the subroutine terminates.

If suitable locations are found, fittings are added to the first line and the last line. These fittings are connected with pipe. Each line pipe is found and evaluated to determine if it crosses the new main. If it does, the line is connected to the main by a riser nipple where they cross. The process repeats itself until no lines remain. At this point, the main is elevated and hangars are added.

Alternatively, a main can be added in space 222. The proposed starting location, ending location and orientation are obtained. Fittings are added to both the starting and ending locations. A pipe is added which connects the two fittings. Lastly, the main is elevated and hangers added.

A main can be deleted 223 if desired. If the main has a sloped overhang, the slope is first set to zero. The pipes which make up the main along with corresponding fittings are deleted until no such pipe remains.

Quite a number of the subroutines found in both the edit line submenu of FIG. 15 and the edit main submenu of FIG. 16 are equivalent.

For example, the wall type 224 (e.g. thickness and composition) or the diameter of a line/main 211/215 can be changed on all lines/mains 228, on one line/main 226 or on one part of a line/main 227. The line/main to be changed is selected as well as the new wall type or diameter. Each pipe in the line/main is changed until all have been altered. If it is determined that the cut length of any altered pipe is too small, the wall type or diameter is changed back to the old type and a message to that effect is generated.

The slope of a line/main 229 can be changed by selecting the line/main, the fitting on the end of the line/main to move and the orientation to move. The slope can be changed by either obtaining a direction and amount to move or a direction, a slope and a fitting to move. If the latter, checks are made to be assured that the desired slope is greater than one inch (2.5 cm) in ten feet (3 meters). If less than that slope, the user is prompted to slope only part of the line/main.

A check is performed to see if any fitting will be bent past tolerance by the proposed slope. Also, a check is made to discover any other pipes which are attached to the line/main (not counting riser nipples). If either situation is found, the subroutine terminates.

A line/main pipe and its respective fittings are then found. The fittings are moved to the correct location for the desired slope which also moves the pipe. Another line/main pipe is found and its fittings moved and so on until all such pipes and fittings have been moved. At that point, the pipe lengths and hangers are adjusted. If this is a main, lastly the riser nipples are adjusted.

A line/main can be moved 230 by selecting the pipes to move and the direction and distance to move. A check is made to determine if pipes connected to the line/main which are not in the line/main can also be moved. If not, the subroutine terminates.

A pipe in the line/main and a fitting at one end are moved. If other pipes are in fitting, these are also moved. The process repeats until all pipes and fittings both in the line/main and connected thereto are moved. The riser nipples and hanger are finally adjusted. Lastly, a check is made to be certain that the moved line/main is not hitting anything.

Couplings can be added to a line/main 231. A line/main is selected as well as the fitting to start. The distance between couplings, the direction to add the couplings and a location for the new couplings are obtained. A pipe on the selected line/main is found.

If the pipe has a location to add a coupling, that location is found and the coupling added. The process cycles until all desired couplings are found. Hangers are then adjusted.

To delete couplings 232, a search for all couplings on a line/main is made. Any such couplings are deleted. Once complete, the hangers are added.

Lines/mains are optionally labelled 233. The editing function allows such labelling to be turned on and off as desired. The on and off labeling routine continues pipe by pipe until completed.

Figure 17:
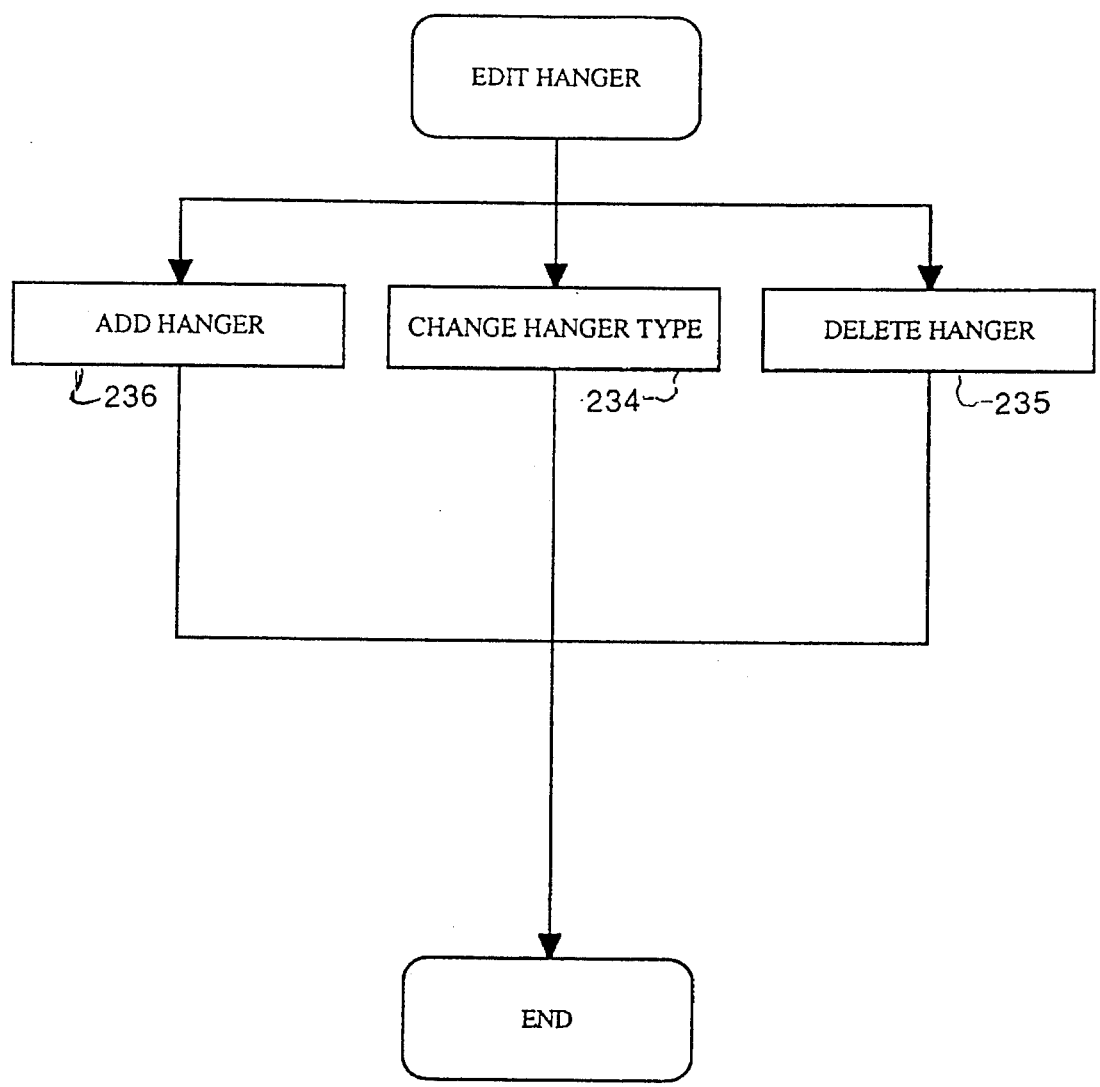
FIG. 17 represents the editing hangers submenu of the preferred embodiment.

FIG. 17 shows the submenu for editing the hangers. This portion of the editing menu is less complex than those depicted in earlier submenus.

To change a hanger type 234, the hanger to be changed is obtained as well as the desired hanger type. The new type is simply substituted and a new rod length calculated.

Hangers may be deleted 235 either individually, by pipe, by line or to the entire distribution system. To delete an individual hanger, it is simply selected and deleted.

To delete all hangers, a cycle begins where each hanger is found. The same cycle occurs with the process of deletion of hangers on a pipe or a line with the additional search criteria that a selected hanger must be on the pipe or line.

Hangers can be added 236 to a location to a pipe. If a location, the pipe at this location is found as well as its orientation and end points. A check is made to be certain no other hangers are too close. If a hanger is too close, the subroutine terminates.

Next, it is determined whether or not the hanger will be mounted on, in preferred order, concrete, a joist or a beam, or trapeze style from two steel parts. If none of the above are found, the subroutine will also terminate. The rod length is calculated, the hanger type determined and the hanger added.

Hangers are added to a pipe by first selecting the pipe. The orientation and distance to the nearest steel is determined as well as the distance to the feed main. The start and end fittings of the selected pipe are found as well as the location on the pipe to start.

The program determines whether the hanger will be mounted on a joist, a beam or trapeze-style from two such pieces of steel. If no mounting locations are found, the program terminates. Once a suitable mount is found, rod lengths are calculated and the position and type of hanger are added. A check is made to determine if the location of the hanger is too far from the pipe ends. If so, more hangers are added until the pipe is properly supported.

To change hanger type, the new type as well as the hanger to change are determined. The change is simply made at that point.

Figure 18:
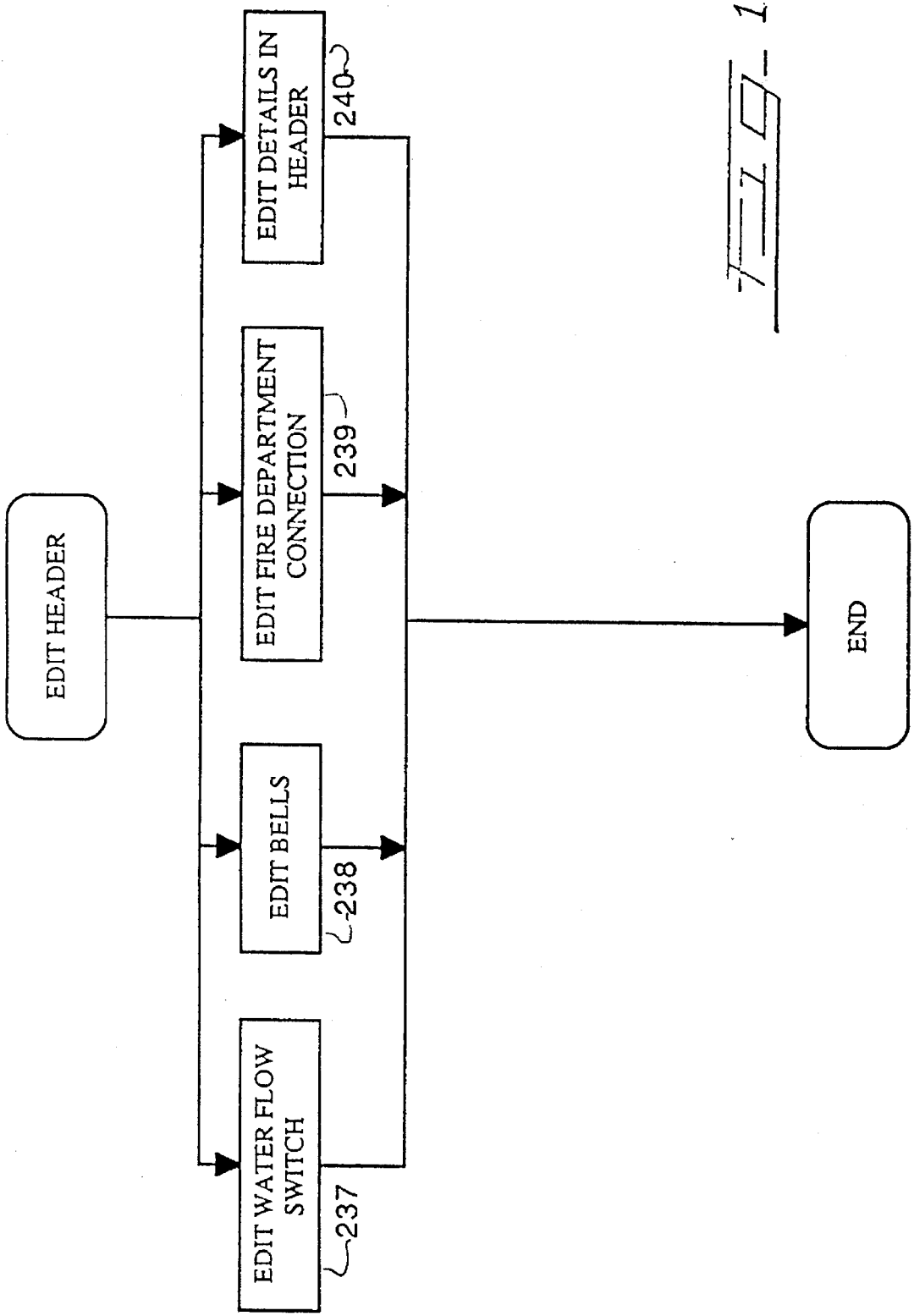
FIG. 18 represents the editing headers submenu of the preferred embodiment.

In FIG. 18, the submenu for editing the headers is shown. This submenu also includes options for editing certain auxiliary portions of a distribution system. These auxiliaries include water flow switches, bells, alarms and the fire department connection.

Water flow switches can be added or deleted 237 as desired. To delete, the water flow switch to delete is simply selected and then automatically deleted. The total number of such switches is reduced by one. The addition of a water flow switch is simply the reverse except a check is also made to be certain a water flow switch is not already positioned there.

Bells can be added, deleted or changed 238 as desired. To add, it is necessary to determine whether the bell to be added is inside, outside or both as well as the wall to mount it upon. The bell is drawn and its location and number stored. Deletion is the reverse process. To change, a bell is selected with the desired change and it is simply made and stored.

A fire department connection can be added, deleted or changed 239. If no such connection exists, it may be added if desired. A wall is selected for the connection as well is a riser to start building the connection. The riser elbow in replaced with a tee. A check valve, an elbow, a pipe and finally the connection itself are added in sequence.

To delete a connection is the reverse of adding. The process starts with the connection and deletes pipes and fittings one by one until the check valve is reached. It then goes one more fitting. In addition, an inside and outside bells can now be deleted if desired. Further, any detail box for the connection can be deleted as well. After both deletion and changing of the connection, a check is made to determine if a new connection should be added.

Turning now to the headers themselves, the details of header can be changed as desired 240. Included among these options are the addition, deletion and change of headers.

A header can be added as a new component or to replace an existing header. In replace an existing header, the line where the riser is found is obtained. That line together with the water flow switch, the pipe stands, dimension lines for the measurements the building and components, and the bells are all deleted. Thus the existing line is removed to allow for addition of its replacement. Of course, deletion is available even if a replacement is not desired.

There are three options to build a header, (1) automatically, (2) by recall of a stored header and (3) by custom building. A header can be automatically built by obtaining the location of the water stub-in, the default header diameter and the header direction. A flange followed by a flanged tee are added to the underground pipe. One end of the flanged tee will go to domestic service. The other end will have a OS&Y valve.

As an option, a backflow preventor followed by a second OS&Y valve can be installed. In either case, the last OS&Y valve is followed by a secured flanged tee. One end of the second flanged tee can include a fire department connection if desired.

If more than one system exists in the building, an OS&Y valve is added at the other end of the tee. Whichever system is employed, a vertical pipe is now positioned on the previous fitting. A weld cross is added to the vertical pipe.

An angled main drain is added to one side of the weld cross with a gauge assembly on the other. A second vertical pipe with a cap is added to the top of the cross. Bells and a flow switch are the last additions to complete the header.

Once a header is built, it can be stored into memory. As such, it can be easily recalled for use where another header is desired.

A header can also be custom-built. The process is the same as an automatic build up to adding the flange to the underground pipe. After that point, the fittings submenu (FIG. 13) will come up and a header can be custom-designed.

Once the header is completed by the installation of a cap or a plug, or deciding that it is finished, the positions of the flow switch, the pipe stands and the dimensions are obtained. These items are added and the custom-built system is finished.

The header direction or location can be changed. For example, the direction can be changed by obtaining the new direction desired. The existing header is stored in memory and then deleted. A water stub-in is then added at the header's location. A loop is performed in which the direction of each fitting in the stored header is changed be accommodate the new direction. The stored header is then recalled.

The header can also be moved a distance and a direction. Both the distance to move and the direction are obtained. A check is made to be certain that the new location will not be outside the building. If it is, the subroutine terminates. If not, the amount is added to the X, Y coordinates of all end points of the header, thus moving the entire header the desired direction and distance. In essence, the same procedure is followed to move to a new location.

In addition, the fittings and the pipes in the header can be edited as discussed previously for pipes and fittings in general. In addition, spools and pipe stands can be added or deleted. The diameter of either the header or the underground pipe are also editable.

Figure 19:
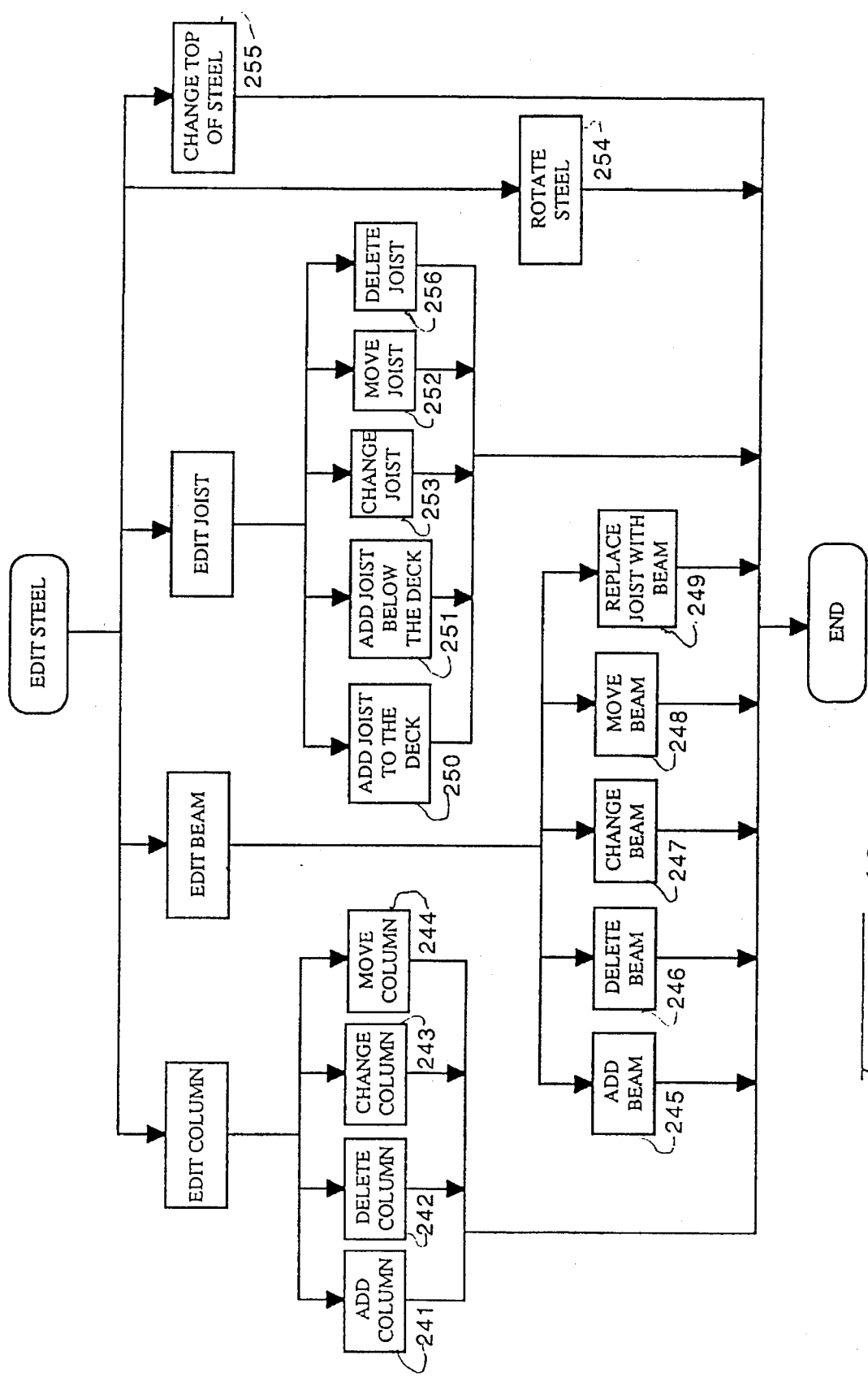
FIG. 19 represents the editing structural elements (steel) submenu of the preferred embodiment.

The steel or structural elements of a building can also be edited as shown in FIG. 19. The user would select the desired option from the edit steel submenu as desired.

For example, a column can be added 241 on a wall, on a beam or at any X, Y location. The X, Y location or the location on the beam or the wall are obtained. The column angle, its depth and its width are also gathered.

A check is made to be certain that no other columns would contact a column at the desired location. If none is found, the column is added.

To delete a column 242, it is simply selected and deleted. To move a column 243, the desired column is selected along with a direction and distance to move. The column is simply moved to the new location.

The type, angle or size of a column may be changed 244 also. The type (I-beam, rectangular or circular) and the angle is obtained along with the desired column. The change in then made.

To alter the size, the column is first selected. If it is a circular column, the new diameter is obtained and the change is made. If it is a non-circular column, the new column depth and width are obtained. A check is made to be certain the new dimensions are less than 8 feet (3.25 meters) and then the change is made.

A beam can be added 245 as desired. The first and second end points on either a column, a beam or a wall are selected. A check is made to be certain the first and the second points are not in the same beam, column or wall. An error message is generated to that effect if they are.

The beam depth is obtained. A check is made to determine if the beam is to the deck which automatically sets the height of the beam. If it is not, then the beam height must be obtained.

A check is made to be certain that the new beam does not cross other beams. If it does, an error message is generated. If it does not, the beam is added and the two end points corrected for the wall, column or beam elevation.

A beam can be deleted 246 if desired. A check is made to determine if joists on both sides will match up. If not, a warning message is generated though the deletion can still occur.

The matched joists on both sides are connected together while unconnected joists are deleted. All beams and joists which are left overhanging columns (stumps) are extended or deleted as needed. This process deletes the beam.

A beam can be changed 247 in a number of ways. For example, the beam elevation, depth and width can be changed by simply selecting the beam to change and the desired change. It is then made and adjustments to the elevation of the line and main are automatically made.

The bearing plate thickness of a beam can be changed as described above except a check is made to be certain that the new thickness is not greater than the joist depth. If it is, there will be a joist in space not bearing on anything. The hangers are adjusted and the line and main are elevated if needed. All beams or one beam can be changed.

A beam's elevation may be changed if desired. This can be done in a number of ways. For example, the end point elevation can be changed by selecting the end point on a given beam. Alternatively, a splice point may be added to a beam by selecting a location for the splice point on the beam. If the desired splice point is too close to the end point, the program will recycle to ask for a new splice point.

In either the end point change or the addition of a permitted splice point, there are four options for obtaining the new elevation. First, the current top of steel number may be used. Second, the beam on both sides of the splice may be found and the desired change can be to line up with the found beam. Third, the previous elevation can be used. Lastly, a new elevation may be obtained.

After the new elevation is found, the room height is changed if needed and the new splice point is added in.

A splice point can also be moved if desired. The splice point to move is obtained as well as the distance and direction to move. Again, a check is made to be certain that the new location is not too close to the end of the beam. In addition, a second check is made to be certain that new location is actually on the beam. If both checks are satisfactory, the old splice point is deleted and the new one added.

A splice point may simply be deleted by selection of the point to eliminate. A check is made to be certain that the point to delete is not intersecting a location on a perimeter bearing wall. If it is, the splice cannot be deleted as a beam cannot go through a perimeter bearing wall. If it is, then an error message is generated and the a new location may be selected. Otherwise, the splice point is simply deleted.

A beam or collinear beams can be moved 248. First, the columns attached to the beam(s) are found. Any columns which also attach to beams which are not being moved are retained. The direction and distance to move are obtained. A check is made to be certain that another beam is not already at the new location. A second check is made to be certain that the new location for the beam will not cross an existing beam. If either check is affirmative, a message is generated and the subroutine terminates.

The beam to be moved is then deleted. Columns are then either added or moved if attached to the moving beam. A check is made to determine if the new location will hit any pipe. If so, a warning message is generated though the process can still proceed. The beam is added at the new location and the steel is adjusted.

A joist may be replaced with a beam 249. The joist to replace is obtained. The closest beam to the joist is then found. The joist is deleted while a beam is added to the location that the joist occupied. The hangers are then adjusted accordingly.

A joist can be added to the deck 250. A point to add a joist to is selected. Two joists on either side of the point are then found. A check is made to be certain that two joists have been found. If not, the end points of the new joist must be obtained. If two joists are found, then the same starting and ending location as these two joists will be used for the added joist.

The joist depth is obtained. Checks are made to be certain that the new joist is not too close to another joist or that the new joist does not cross another joist. If either event is found, then an error message is generated and the subroutine terminates. The panel width and offset are then obtained and a new joist is added.

A joist can be added below the deck 251. A first and a second point are obtained on beams along with the joist depth. Three checks are made to determine that the first and the second point are on two separate beams, that the two beams are oriented in the same manner and that the new joist will not hit any walls. If all of these conditions hold, the new joist is added. If any one does not hold, an error message is generated and the program will hunt for a second point that does meet the proper criteria.

A joist can be moved 252. The joist is selected and the direction and distance to move are obtained. A check is made that the new location for the joist will not hit any walls. If it does, the process will obtain a new distance to move. If it does not hit a wall, then the joist is moved to the new location. The joist's elevation at the new location is determined and the hangers adjusted if needed.

Joist panels, depths, offset or spacing may be changed 253. To change the depth, the joist to change is selected and the new depth obtained. A check is made to compare the bearing plate thickness to the new joist depth to be certain that this depth is not less than that thickness. If it were, then there would be a joist in space not bearing on anything. If the new depth passes that check, the depth is changed to the new value, the lines elevated if needed and the hangers adjusted accordingly.

The joist offset is changed by selecting the joist to change and obtaining the new offset. A check is made to be certain that the offset is not greater than the length of the joist. If it were, there would be no panels for the joist and this is impossible. If it passes this check, the desired direction is obtained and the offset assigned. The lines are elevated and the hangers are adjusted if needed.

The joist panel change is done in several different ways. The number of "A" or "V" webbing can be altered. The joist to change is selected and the new number obtained. A check is made to be certain that the number of panels times the length of each panel does not exceed the total length of the joist. If it does not, the new number is assigned to the selected joist.

A vertical bar can be added or deleted to the "A" or the "V" webbing. The joist to add to or delete from is selected and the addition or the deletion is made. Center "A" or "V" webbing can be selected for all joists also.

The panel width can be changed. The new panel width is obtained and the new panel width is assigned to the joist(s).

The joist spacing can be changed. An area to change is selected and all joists entirely within this area are found. All of the found joists are then deleted from the distribution system. The beams and walls closest to the system are found along with the distance form one end of the area. The new spacing between joists is obtained as well and the joist depth. The new joists are added to the area. The elevations for these new joists are assigned based on the elevation of the beams and walls which were found previously.

The steel can be rotated 90 degrees 254 if desired. A bay section is selected for rotation. All the joists in that bay section are then deleted. If no other joists are found on beams in the bay section, the beams are also deleted. A check is made to determine if beams exist in the location that is needed to rotate the steel. This location is at both ends of the rotated orientation. If no beams are found, such beams are added in.

The spacing, depth, panel width and offset of joists are obtained and the chosen joists added in the rotated orientation. Hangers are then added to pipes in the bay section.

The top of steel may be changed 255 by obtaining the highest and lowest points of all beams and joists which reach the deck. A check is made to be certain that the elevation (z-location) of all the steel in the building is the same. If it is, the building is level and the new top of steel value can simply be obtained. If not, then the amount to raise or lower the deck elevation must be obtained. If we are raising the top of the steel, then the deck elevation is changed as well as the pipe elevations.

If, however, we are lowering the top of steel, then a series of checks must be performed to be certain that (1) the new top of steel is above the lowest part of the building, (2) the steel at the new location does not hit any walls below the deck, (3) the new elevation is above the ceilings and (4) the new elevation for the steel does not hit any steel below the deck. All of the above conditions must be met before the new elevation of top of steel is allowed.

A joist may be deleted 256 by simply selecting the joist and deleting it from the distribution system. Any hangers that need adjustment are corrected.

Figure 20:
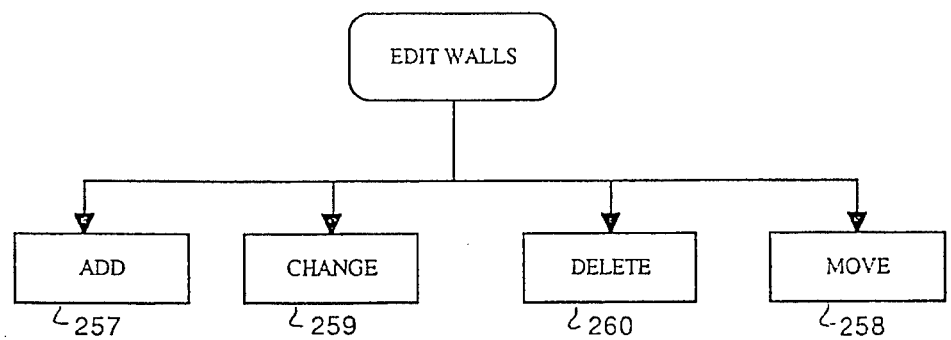
FIG. 20 represents the editing walls submenu of the preferred embodiment.

In FIG. 20, the edit walls submenu is shown. As with all previous submenus, the user simply selects the desired option and the process proceeds.

A wall can be added 257 to the building. A first point is obtained on an existing wall to start the new wall from. A second point for the other end of the new wall is obtained and an attempt is made to line up the new wall with an existing wall either in a perpendicular or a parallel orientation. A check is made to be certain that the new wall will not overlap an existing wall and that the attempt to line up has been successful. If either condition fails, an error message is generated and the program looks for a new second point.

If this is the first wall added, then the room number is found for the new wall. Then, the closest wall and the distance to it in the direction of the new wall is found. A check is made to determine if this new wall is too far away. If it is, the wall thickness is obtained and the second wall is used as the first point for the next new wall.

If the distance is not too far, then the new wall is connected to the found existing wall. The wall thickness is obtained and a check is made to determine if the added walls are inside any room. If they are, then a new inside room is added to the database. If they are not, then a new outside room is added to the database.

Walls can be moved 258 within the building by three differing procedures.

First, a corner can be slid. The corner and the wall to slide are obtained. Available walls to slide along are found and one of such walls is selected. The direction to move and the distance to move are obtained. This distance must be greater than the wall thickness. If the distance is greater, then the wall is slid along the selected available wall the chosen distance and direction.

Second, a part of a wall may be moved. A first and a second point on the wall are selected. A check is made to be certain that there is enough room between the two points to add a wall. A direction and a distance to move are obtained and another check made to be certain that the distance is adequate to allow a new wall to be added without hitting existing walls. The wall part is then moved if it passes this check.

Third, a wall segment consisting of either a whole wall or a part of a wall can be moved. If a whole wall, that wall is simply selected. If part of a wall, the particular segment is selected. In either case, the distance and direction to move are then chosen. Another check is made to be certain that the distance to move is large enough. If it is, then the move is made.

A new inside room may also be added. The height of the new walls is obtained. Walls which form a closed area starting from the last added wall and continuing counter-clockwise until the starting point is reached again are found. This process is repeated from the same point but in the clockwise direction also. The smaller of the two rooms thus obtained is deleted and the larger retained.

Those walls which are in the new room but no longer belong to their original room are deleted from the original room's database. The ceiling grid information from the original room is copied to the new room. The room number of those components which are in the new room are changed to the new room's number. Any head which is not in any room (such as one which is on the edge of a new wall) is deleted. The ends of all mains are adjusted accordingly.

A new outside room may be added. The counter-clockwise rotation from the starting point as described for the inside room is also performed here. The height of the newly added walls above the deck are assigned as well as the default hazard for the new room. The walls thickness and locations can be changed if desired. After such changes, the steel is put in as well as the pipes for the room.

The walls can be changed 259 in a variety of ways. The thickness of a wall is changed by obtaining the wall segment of the whole wall to change. The new wall thickness is obtained and a check is made to be certain that the new wall thickness will not cause the wall to hit anything. If the wall is an outside wall, the thickness is changed by maintaining the outside surface of the wall while thickening the inside surface. If the wall is an inside wall, the center location is maintained while both surfaces are moved.

A wall height can be changed by selecting a wall segment, a whole wall or a corner. If a wall segment or a whole wall, the new height is obtained and assigned to the desired area. If a corner, the corner height is first changed. Then any bearing wall which are at the corner are found and joists and beams on the bearing walls must also be adjusted.

A wall can be split by selecting the point where the split is desired. Beams are found which are at the same orientation as the wall and which lie on the wall. The beams are split at this point (see process described above) as well as the walls.

A corner can also be changed by moving its location or by altering its radius. To move the corner, the desired corner is selected. If this is a round corner (radius does not equal zero) it is changed into a square corner for the move. The distance and the direction for the move are selected and a check made to be certain that the new location is not too close to another corner such that the walls of the respective corners will hit each other.

A further check is made to be certain that the walls that will be moved do not hit another wall. The new position is assigned to the chosen corner and heads which would be either outside the building or on the edge of a wall are deleted. The ends of the mains are adjusted as well as the steel.

The radius of a corner can also be adjusted. The corner to change and the new radius are selected. Checks are made to determine that (1) there are only two walls on the corner, (2) the angle between the two walls must be 90 degrees and (3) the radius must be greater than the wall thickness or zero and less than the shortest length of either wall.

The overhead doors on a round corner are deleted and the new radius is assigned to the corner. The steel is adjusted and any heads now outside the building or on the wall edge are deleted. The ceiling grid is also corrected.

A wall can be selected for deletion 260. A check is made to see if the rooms on both sides of the wall are the same. If they are the same, then a check is made to determine if a joist is supported by the wall. If so, then there must be a beam at that location to support the joist. If no beam is located there, then such a beam must be added at the wall's location to support the joist. Columns will be added if needed to support the beam.

A further check is made to see if the wall is an outside wall. If it is, then the other walls in the room must be changed to reflect their new status as outside walls after this wall is deleted.

The room to delete is found and its components are deleted, the ceiling grid erased, the overhead doors erased, the wall deleted from the database and the rooms joined. If this is an outside wall, then heads which are now outside are deleted, the ends of mains and the steel adjusted.

Figure 21:
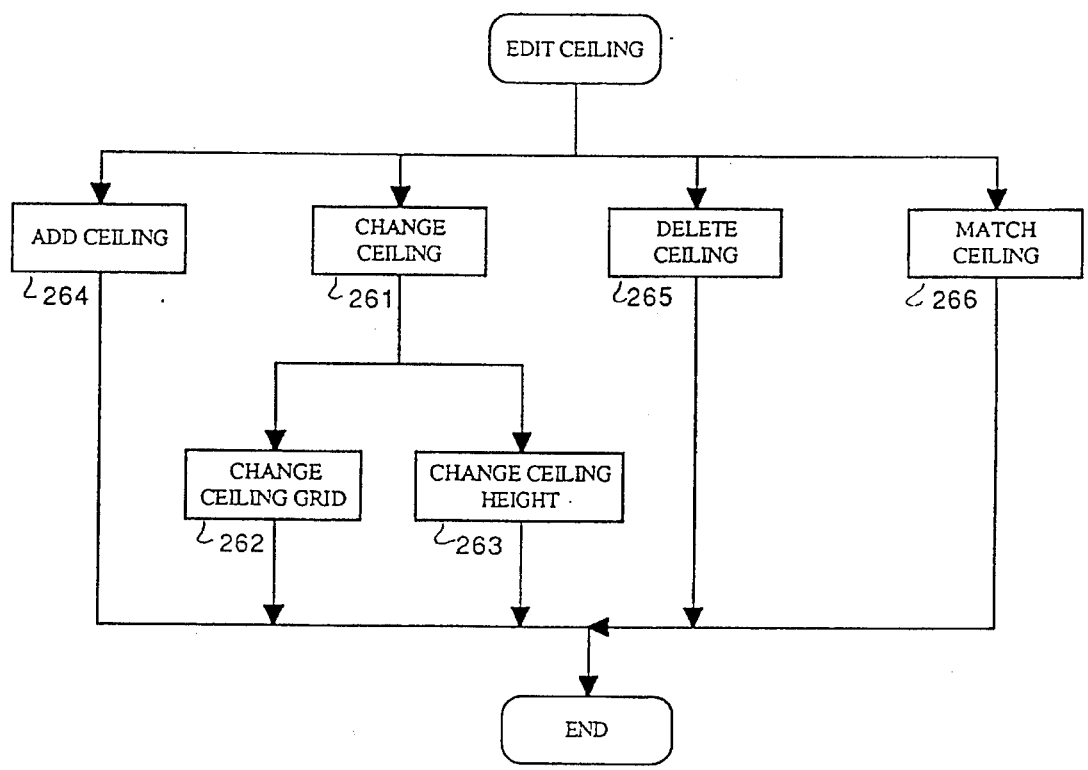
FIG. 21 represents the editing ceiling grid submenu of the preferred embodiment.

The ceiling grid submenu is shown in FIG. 21. As is standard procedure, the option desired is selected and the subroutine which performs the option executes.

To change the ceiling grid 261 in a room 262, the room is selected in which the change is to occur. Then, the ceiling grid in the room can be changed by (1) adding a ceiling grid, (2) changing a ceiling grid line, (3) deleting a ceiling grid or (4) moving a ceiling grid.

To add a ceiling grid in a room, the ceiling panel size and the ceiling grid angle are obtained. Also, the far left, far right, far back and far forward points in the room's ceiling grid line coordinate system are obtained. The starting and ending grid line locations are obtained with respect to the ceiling grid coordinate system. These locations are then translated into the coordinate system for the building. The database is then updated including the other rooms.

A ceiling grid may be deleted by simply assigning zero to the variables about the ceiling grid line in the selected room. The database is then updated.

A ceiling grid can also be moved by obtaining the direction and distance to move. The default value for the panel widths is checked to be certain that it is larger than the distance the grid is to be moved. Otherwise, a new distance and direction must be entered before the grid can be moved.

A ceiling grid line may be changed by (1) changing the panel size, (2) changing the ceiling grid angle and (3) adding, deleting, moving or shifting a single grid line.

The panel size may be changed by obtaining the new panel size, deleting the old panels and adding a new grid which utilizes the new panel size. The process for altering the ceiling grid angle is essentially the same.

To add a single grid line, the location to add the line is obtained. A check is made to be certain that the new grid line will not be too close to an old line or lines. If it is, a new location must be entered to proceed. If the line is not too close, then the new line is added and the database updated.

A single grid line may be deleted by simply selecting it. The line is deleted and the database updated.

A single grid line may be moved by obtaining the direction and distance to move. A check is made to be certain that the new position will not interfere with existing grid lines as was done for adding a single grid line. If the location is acceptable, the move is made and the database updated.

A set of ceiling grid lines may be shifted in a process which is virtually identical to the process for moving a single grid line. The process is a little more complicated since one must check a number of lines instead of one. In addition, the lights and duct openings inside the moving set of grid lines must also be moved.

The height of a ceiling can also be changed 263. The room to change is first selected. The old height is saved while the new height is obtained. Checks are made to be certain that this new height is (1) not above the height of the walls in the room and (2) the height is not above the lowest elevation of the steel in the room.

If the new height passes the two criteria cited above, the ceiling height for the room is changed. All sprinklers which were below the old ceiling height are moved to a new position which is six inches (15.25 cm) below the new height.

A ceiling may be added 264 to a room without one. The ceiling height is obtained and checked as described in the subroutine for changing the height of a ceiling. If it passes those criteria, the height is assigned to the room. The subroutine will allow the user to enter a ceiling grid at this point if desired.

A check is made to determine if the room has sprinklers in it already. If it does, these sprinklers can be changed to pendants six inches (15.25 cm) below the new ceiling if desired. Also, the hazard type for the room can be changed if needed.

A ceiling in a room can also be deleted 265. The room to delete is chosen and the ceiling height is saved. All the variables relating to the ceiling are set to zero. A check is made to determine first if there were any sprinklers in the room. If so, then a comparison is made to see if any of these sprinklers were lower than the saved height of the ceiling. If any of the sprinklers were lower than that height, then they are repositioned six inches (15.25 cm) under the roof.

A ceiling grid may be matched to the ceiling grid in another room. The room to match as well as the paradigm room are selected. The ceiling grid in the room to match is deleted along with the lights and duct openings. The ceiling grid information from the paradigm room is used in the now empty match room and a ceiling grid is added.

An entire distribution system may also be matched to an existing system in a multi-system building. The paradigm system is selected as well as the current system to be changed. The paradigm is substituted (and drawn if desired) for the current system. The appropriated editing functions as previously described are available for use to customize sections of the system is needed.

The hazards in a room or a section may be changed as desired. In both cases, the room or section is obtained along with the desired new hazard. The old hazard is deleted and the new one substituted.

Information can be obtained from the system at any time by simply selecting the type of item to get information on. The item is found and highlighted by the computer and the information is displayed.

Information may also be calculated for certain items. For example, the clearance information relating to a given pipe and any other element can be obtained by selecting the pipe and the element. The distance between the pipe and the element is calculated by allowing for the outside diameter of the pipe and the outside dimensions of the element. If the distance is negative, the pipe and the element are contacting each other and a warning message is generated. If the distance is very far, the clearance is irrelevant and will not even be displayed. Otherwise, that clearance is shown.

The above distances can be calculated for any two items in the database. A dimension line will be drawn between such chosen items and the distance is displayed.

The volume of piping which is located past a certain fitting is calculated in an alternative fashion. Each pipe past the selected fitting is found and its volume calculated and added to a running total. When the iterations find no further pipe past the fitting, the total volume is converted to gallons and displayed. Essentially, the same alternative process is used to calculate the total volume in a given line.

The sprinkler coverage on a given line can be checked. The line is selected and the sprinklers on the line are found one by one. The coverage of the found sprinklers if obtained and compared to the required coverage to determine if it is adequate. If it is not, that particular sprinkler is highlighted in red.

Next, the deflector distance is obtained. If this deflector distance is the largest or the smallest found, the respective distance is saved. Otherwise, the iteration continues to the next sprinkler until no sprinklers remain. The largest and smallest deflector distances are displayed along with warning messages relating to any sprinklers found with inadequate coverage.

A sprinkler or pipe count can be obtained from the database. Again, an iterative process cycles through each sprinkler or pipe which is found in the system. The sprinkler is performed by type, temperature range, size and style. The pipe count is performed by length, diameter and wall type. Once all the sprinklers or pipes have been accounted for, the total number of each category as well as the total number in the system is displayed.

If desired, sprinklers or pipes of a given kind can be highlighted. Again, an iterative process goes through each sprinkler or pipe in the system. All those of the desired kind are found, highlighted and counted.

The pipe interference on a given line may by checked. Each pipe in the line is separately checked to see if it is hitting any structural elements or elements of the distribution system. If it is, such elements are highlighted and a warning message is displayed.

The high and low point on the beams can be calculated in an iterative process. Each beam in the system is found and its elevation at splice points and each end point are found. If the highest or the lowest elevation of all the beams found, such numbers are saved. Once all the beams have been tested, the high and low points are highlighted.

Lastly, head spacing information can be obtained from the database. The area width across the lines and the area length in the direction of the lines is obtained. The area dimensions are displayed along with the maximum sprinkler spacing and coverage area for the hazard type in the area.

Optionally, the maximum spacing and coverage areas can be changed at this point. If such a change is made, then the method described above for calculating the sprinklers needed is performed and information displayed. Again, optionally, the number of lines, distance between lines, number of sprinklers or distance between sprinklers can then be edited if desired.

The foregoing is illustrative of the principles of the invention. Further, since numerous modifications and changes will readily occur to those skilled in the art, it is not desired to limit the invention to the exact construction and operation shown and described. Accordingly, all suitable modifications and equivalents may be resorted to while still falling within the scope of the invention.

What is claimed is:

1. A method for designing a distribution system having delivery components and producing a layout of the system for a building or a portion of a building, the method comprising in combination the steps of:

(a) storing, in digital form in first memory means, generic dimensional and operation requirements of distribution system elements including the delivery components from which the distribution system can be constructed;

(b) storing, in digital form in second memory means, requirements of at least one building standard relating to the operation of the delivery components from which the distribution system can be evaluated;

(c) entering input data into a computer operatively connected to the first and second memory means, the input data including the location and dimensions of building elements and adjuncts;

(d) identifying the requirements of at least one building standard in the second memory means to be used;

(e) electronically designing a layout automatically for the distribution system using the generic dimensional and operation requirements of distribution system elements stored in the first memory means, during which the operation of the delivery components being evaluated and the layout being designed to comply with the requirements of the at least one building standard;

(f) editing one of the building elements, adjuncts and the layout;

(g) electronically checking the edited one of the building elements, adjuncts and the layout for compliance with the requirements of the at least one building standard; and (h) redesigning the layout to include the edited one of the building elements, adjuncts and the layout if in compliance with the requirements of the at least one building standard.

2. The method of claim 1 wherein the step of electronically designing the layout for the distribution system further comprises generating from the designed layout a hard copy detailing of the distribution system, the hard copy including a list that includes the distribution system elements, the list being printed out in the order the distribution system elements will be used.

3. The method of claim 1 wherein the building elements and adjuncts include beams, columns, girders, floors, ceilings, electrical systems, phone lines and walls.

4. The method of claim 3 wherein the distribution system is a sprinkler system for fire prevention and the distribution system elements include piping components of the sprinkler system.

5. The method of claim 4 further comprising the step of dividing the building into a plurality of sections by dividing the building into bays which are defined by the beams which are oriented horizontally whereby the bays define the sections, and the step of electronically designing further includes electronically designing a layout for the distribution system in each section.

6. The method of claim 4 further comprising the step of dividing the building into a plurality of sections by dividing the building into rooms which are defined by the walls wherein the rooms define the sections and the step of electronically designing further includes electronically designing a layout for the distribution system in each section.

7. The method of claim 1 wherein the step of electronically checking the edited layout further comprises performing an obstructions analysis to ensure the layout does not intersect with the building elements and adjuncts.

8. The method of claim 1 wherein the step of editing edits the location and the dimensions of the building elements or adjuncts.

9. The method of claim 1 wherein the step of editing edits the layout.

10. The method of claim 1 wherein the step of entering the input data further comprises choosing any one of the distribution system elements to be optimized.

11. The method of claim 1 wherein the step of electronically checking the edited layout further comprises performing a hydraulic analysis of the layout to determine compliance with the requirements of the at least one building standard.

12. The method of claim 1 wherein the step of editing further comprises the steps of:

obtaining data necessary to effect a proposed change, the data including which one of the distribution system elements, building elements and adjuncts is to be changed, and the proposed change thereto;

finding, in the first memory means, the dimensional requirements of the proposed change to the distribution system element if the data includes which one of the distribution system elements is to be changed;

checking the dimensional requirements of the proposed change with the layout to determine if the proposed change is feasible;

making the proposed change if feasible, or generating an error message if the proposed change is not feasible; and adjusting the layout to accommodate the proposed change if the proposed change is feasible.

13. An apparatus for designing a distribution system having delivery components and producing a layout of the system for a building or a portion of a building, the apparatus comprising in combination:

(a) first memory means for storing in digital form dimensional and operation information of distribution system elements including the delivery components from which the distribution system can be constructed;

(b) second memory means for storing in digital form requirements of at least one building standard relating to the operation of the delivery components from which the distribution system can be evaluated;

(c) means for entering input data into a computer operatively connected to the first and second memory means, the input data including the location and dimensions of building elements and adjuncts;

(d) means for identifying the requirements of at least one building standard stored in the second memory means to be used;

(e) means for electronically designing a layout automatically for the distribution system using the dimensional and operation information of distribution system elements stored in the first memory means, the operation of the of the delivery components being evaluated and the layout being designed to comply with the requirements of the at least one building standard;

(f) means for editing one of the building elements, adjuncts and the layout;

(g) means for electronically checking the edited one of the building elements, adjuncts and the layout for compliance with the requirements of the at least one building standard; and (h) means for redesigning the layout to include the edited one of the building elements, adjuncts and the layout.

14. The apparatus of claim 13 wherein the means for electronically designing the layout for the distribution system further comprises means for generating from the designed layout a hard copy detailing of the distribution system, the hard copy including a list that includes the distribution system elements, the list being printed out in the order the distribution system elements will be used.

15. The apparatus of claim 14 wherein means for editing edits one of the location and the dimensions of the building elements and adjuncts.

16. The apparatus of claim 13 wherein the building elements and adjuncts include beams, columns, girders, floors, ceilings, electrical systems, phone lines and walls.

17. The apparatus of claim 16 wherein the distribution system is a sprinkler system for fire prevention and the distribution system elements include piping components of the sprinkler system.

18. The apparatus of claim 17 further comprising means for dividing the building into a plurality of sections that includes means for first dividing the building into bays which are defined by the beams which are oriented horizontally whereby the bays define the sections, wherein the means for electronically designing electronically designs a layout for the distribution system in each section.

19. The apparatus of claim 17 further comprising means for dividing the building into a plurality of sections that includes means for first dividing the building into rooms which are defined by the walls wherein the rooms define the sections, wherein the means for electronically designing electronically designs a layout for the distribution system in each section.

20. The apparatus of claim 13 wherein the means for electronically checking the edited layout further comprises means for performing an obstructions analysis to ensure the layout does not intersect with the building elements and adjuncts.

21. The apparatus of claim 13 wherein the means for editing edits the layout.

22. The apparatus of claim 13 wherein the means for entering the input data further comprises means choosing any one of the distribution system elements to be optimized.

23. The apparatus of claim 13 wherein the means for electronically checking the edited layout further comprises means for performing a hydraulic analysis of the layout to determine compliance with the requirements of the at least one building standard.

24. The apparatus of claim 13 wherein the means for editing further comprises:

means for obtaining the data necessary to effect a proposed change, the data including which one of the distribution system elements, the building elements and adjuncts is to be changed, and the proposed change thereto;

means for finding, in the first memory means, the dimensional requirements of the proposed change to the distribution system element if the data includes which one of the distribution system elements is to be changed;

means for checking the dimensional requirements of the proposed change with the layout to determine if the proposed change is feasible;

means for making the proposed change if feasible, or generating an error message if the proposed change is not feasible; and means for adjusting the layout to accommodate the proposed change.

25. A method for designing a distribution system and producing a layout of the system for a building or a portion of a building, the method comprising in combination the steps of:

(a) storing, in digital form in a first memory region, dimensional and operation information of elements including the delivery components from which the distribution system can be constructed;

(b) storing, in digital form in a second memory region, requirements of at least one building standard relating to the operation of the delivery components from which the distribution system can be evaluated;

(c) entering input data into a computer operatively connected to the first and second memory regions, the input data including the location and dimensions of elements and adjuncts of the building;

(d) identifying requirements of at least one building standard stored in the second memory region to be used; and (e) electronically designing a layout for the distribution system using the generic dimensional and operation information of the elements stored in the first memory region, the operation of the delivery components being evaluated so that the layout complies with the requirements of the at least one building standard.

26. An apparatus for designing a distribution system and producing a layout of the system for a building or a portion of a building, the apparatus comprising in combination:

(a) a first memory region for storing in digital form dimensional and operation information of elements including delivery components from which the distribution system can be constructed;

(b) a second memory region for storing in digital form requirements of at least one building standard relating to the operation of the delivery components from which the distribution system can be evaluated;

(c) an input data device for entering data into a computer operatively connected to the first and second memory regions, the input data including the location and dimensions of elements and adjuncts of the building;

(d) a standard identifying device associated with the computer for identifying requirements of at least one building standard stored in the second memory region to be used; and (e) an electronic design device associated with the computer for electronically designing a layout for the distribution system, the operation of the delivery components being evaluated so that the layout complies with the requirements of at least one building standard.

27. A method for designing a sprinkler system and producing a layout of the system for a building or a portion of a building, the method comprising the steps of:

(a) storing, in digital form in first memory means, elements from which the sprinkler system can be constructed, the elements including sprinkler heads, pipes and information regarding capacities of the elements;

(b) storing, in digital form in second memory means, requirements of at least one standard from which the sprinkler system can be evaluated, the standard including operation requirements of the elements;

(c) receiving input data into a computer operatively connected to the first and second memory means, the input data including the location and dimensions of elements and adjuncts of the building;

(d) selecting a standard in the second memory means from which the sprinkler system including the heads and pipes will be evaluated;

(e) dividing the building into a plurality of sections based on the input data;

(f) designing a layout for the sprinkler system in each section to comply with the selected standard, the designing including:
  (1) automatically positioning heads and pipes in one of the plurality of sections according to the selected standard;
  (2) automatically determining if the position of each of the heads and pipes is obstructed;
  (3) automatically repositioning the heads or pipes if there is an obstruction; and
  (4) notifying a user when no unobstructed position is determined so that the user can manually edit the position of the heads or pipes or one of the elements or adjuncts of the building;

(g) repeating step (f) for the remaining plurality of sections to complete the layout;

(h) evaluating the operation of the layout including the heads and pipes to comply with the selected standard;

(i) notifying a user when a problem is detected by the evaluation so that the user can manually edit the position of the layout including heads and pipes, or one of the elements or adjuncts of the building;

(j) storing the building sprinkler system layout if no problem is detected by the evaluation; and (k) providing editing capabilities that include:
  (1) editing one of the location and dimensions of the building elements or adjuncts, and the layout including heads and pipes;
  (2) electronically checking the edited layout including obstructions analyses relating to building elements and adjuncts as well as the layout itself, hydraulic analyses or requirements analyses;
  (3) modifying the layout with the edited one of the location and dimensions of the building elements or adjuncts, and the layout including heads and pipes if the checking is satisfactory, otherwise generating an error message;
  (4) performing a test on the modified layout.

28. The method of claim 27 further comprising the step of receiving hazards data which one of the plurality of sections will encounter to determine the positioning and capacities of the sprinkler heads and pipes according to the selected standard.

* * * * *